(12) United States Patent
Omenetto et al.

(10) Patent No.: US 11,009,792 B2
(45) Date of Patent: May 18, 2021

(54) ALL WATER-BASED NANOPATTERNING

(71) Applicant: TUFTS UNIVERSITY, Medford, MA (US)

(72) Inventors: Fiorenzo G. Omenetto, Lexington, MA (US); David L. Kaplan, Concord, MA (US); Sunghwan Kim, Malden, MA (US); Benedetto Marelli, Somerville, MA (US)

(73) Assignee: Tufts University, Medford, MA (US)

( * ) Notice: Subject to any disclaimer, the term of this patent is extended or adjusted under 35 U.S.C. 154(b) by 0 days.

(21) Appl. No.: 14/776,083

(22) PCT Filed: Mar. 14, 2014

(86) PCT No.: PCT/US2014/029571
§ 371 (c)(1),
(2) Date: Sep. 14, 2015

(87) PCT Pub. No.: WO2014/197093
PCT Pub. Date: Dec. 11, 2014

(65) Prior Publication Data
US 2016/0033861 A1 Feb. 4, 2016

Related U.S. Application Data

(60) Provisional application No. 61/788,520, filed on Mar. 15, 2013.

(51) Int. Cl.
G03F 7/039 (2006.01)
G03F 7/20 (2006.01)
G03F 7/16 (2006.01)
G03F 7/32 (2006.01)
G03F 7/038 (2006.01)
G03F 7/00 (2006.01)

(52) U.S. Cl.
CPC ............ G03F 7/039 (2013.01); G03F 7/0037 (2013.01); G03F 7/038 (2013.01); G03F 7/162 (2013.01); G03F 7/168 (2013.01); G03F 7/2059 (2013.01); G03F 7/32 (2013.01)

(58) Field of Classification Search
CPC .......... G03F 7/039; G03F 7/038; G03F 7/322; G03F 7/168
See application file for complete search history.

(56) References Cited

U.S. PATENT DOCUMENTS

| | | |
|---|---|---|
| 5,245,012 A | 9/1993 | Lombari et al. |
| 6,902,932 B2 | 6/2005 | Altman et al. |
| 7,635,755 B2 | 12/2009 | Kaplan et al. |
| 8,195,021 B2 | 6/2012 | Kaplan et al. |
| 2007/0187862 A1 | 8/2007 | Kaplan et al. |
| 2010/0070068 A1 | 3/2010 | Kaplan et al. |
| 2011/0293898 A1 | 12/2011 | Yatake et al. |
| 2012/0121820 A1 | 5/2012 | Kaplan et al. |
| 2012/0268519 A1 | 10/2012 | Ohya et al. |
| 2015/0376248 A1* | 12/2015 | Kurland ................ G03F 7/0388 430/9 |
| 2016/0046138 A1 | 2/2016 | Omenetto et al. |

FOREIGN PATENT DOCUMENTS

| | | | |
|---|---|---|---|
| JP | H07-292306 A | 11/1995 | |
| JP | 2001-152024 | * 6/2001 | ............. C08J 3/12 |
| JP | 2005052162 | * 3/2005 | ............. A61L 15/16 |
| WO | WO-97/08315 A1 | 3/1997 | |
| WO | WO-03/056297 A2 | 7/2003 | |
| WO | WO-2004/000915 A2 | 12/2003 | |
| WO | WO-2004/062697 A2 | 7/2004 | |
| WO | WO-2005/000483 A1 | 1/2005 | |
| WO | WO-2005/012606 A2 | 2/2005 | |
| WO | WO-2005/123114 A2 | 12/2005 | |
| WO | WO-2007/016524 A2 | 2/2007 | |
| WO | WO-2008/118133 A2 | 10/2008 | |
| WO | WO-2008/118211 A2 | 10/2008 | |
| WO | WO-2008/127401 A2 | 10/2008 | |
| WO | WO-2008/127402 A2 | 10/2008 | |
| WO | WO-2008/127403 A2 | 10/2008 | |
| WO | WO-2008/127404 A2 | 10/2008 | |
| WO | WO-2008/127405 A2 | 10/2008 | |
| WO | WO-2008/140562 A2 | 11/2008 | |
| WO | WO-2008/150861 A1 | 12/2008 | |
| WO | WO-2009/061823 A1 | 5/2009 | |
| WO | WO-2009/155397 A2 | 12/2009 | |
| WO | WO-2010/126640 A2 | 11/2010 | |
| WO | WO-2011/012931 A1 | 2/2011 | |
| WO | WO-2011/026101 A2 | 3/2011 | |
| WO | WO-2011/046652 A2 | 4/2011 | |
| WO | WO-2011/115643 A1 | 9/2011 | |
| WO | WO-2011/130335 A2 | 10/2011 | |
| WO | WO-2011/160098 A2 | 12/2011 | |
| WO | WO-2012/031282 A2 | 3/2012 | |
| WO | WO-2012/047682 A2 | 4/2012 | |
| WO | WO-2012/054121 A2 | 4/2012 | |
| WO | WO-2012/094436 A2 | 7/2012 | |
| WO | WO-2012/145739 A1 | 10/2012 | |
| WO | WO-2013/103424 A2 | 7/2013 | |
| WO | WO-2013/130156 A2 | 9/2013 | |
| WO | WO-2014/144971 A1 | 9/2014 | |
| WO | WO-2014/197093 A2 | 12/2014 | |

OTHER PUBLICATIONS

English Translation of Japanese Patent Publication No. 2001-152024, Jun. 5, 2001, Takeshita et al. (Year: 2001).*
English Translation Abstract of Japanese Patent Publication No. 2005052162 ,Kawahara et al., "Production Method of Silk Fibroin Film", Mar. 2005. (Year: 2005).*
U.S. Appl. No. 61/791,358, filed Mar. 15, 2013, Omenetto et al.
Amsden et al., Spectral analysis of induced color change on periodically nanopatterned silk films, Optics Express 17(23): 21271-21279 (2009).

(Continued)

Primary Examiner — Daborah Chacko-Davis
(74) Attorney, Agent, or Firm — Quarles & Brady LLP

(57) ABSTRACT

The present application provides novel methods for the fabrication of nanostructures. More specifically, the invention relates to direct electron beam lithography with the use of silk fibroin as "green" resists.

16 Claims, 18 Drawing Sheets
Specification includes a Sequence Listing.

(56) References Cited

OTHER PUBLICATIONS

Amsden, J.J. et al., Rapid Nanoimprinting of Silk Fibroin Films for Biophotonic Applications, Advanced Materials, 22(15):1746-1749 (2010).
Bae et al., Fabrication of Poly(ethylene glycol) Hydrogel Structures for Pharmaceutical Applications using Electron beam and Optical Lithography, J. Vac. Sci., Technol. 28(6); C6P24-C6P29 (2010).
Bini et al., Mapping Domain Structures in Silks from Insects and Spiders Related to Protein Assembly, J. Mol. Biol. 335: 27-40 (2004).
Brenckle, M.A. et al., Protein-protein nanoimprinting of silk fibroin films, Advanced Materials, 25:(17) 2409-2414 (2013).
Chen et al., Noncovalent functionalization of carbon nanotubes for highly specific electronic biosensors., PNAS 100(9): 4984-4989 (2003).
Chen, W. & Ahmed H. Fabrication of 5-7 nm wide etched lines in silicon using 100 ke V electron-beam lithography and polymethylmethacrylate resist. Appl. Phys. Lett. 62: 1499-1501 (1993).
Dowling, J.P. et al., The photonic band edge laser: A new approach to gain enhancement. J. Appl. Phys. 75(4):1896-1899 (1994).
Duan, H. et al., Sub-10 nm half-pitch electron-beam lithography by using poly(methylmethacrylate) as a negative resist. J. Vac. Sci. Technol. B 28: C6C58-C6C62 (2010).
Fan et al., Sensitive optical biosensors for unlabeled targets: a review. Anal Chim. Acta 620(1-2): 8-26 (2008).
Ferrini, R. et al., Radiation losses in planar photonic crystals: two dimensional representation of hole depth and shape by an imaginary dielectric constant. J. Opt. Soc. Am. B 20: 469-478 (2003).
Hennink, WW and van Nostrum, CF., Novel crosslinking to design hydrogels., Adv. Drug Deliv. Rev. 54(1): 13-36 (2002).
Hu, X et al., Determining beta-sheet crytallinity in bribrous proteins by thermal analysis and infrared spectroscopy. Macromolecules 39: 6161-6170 (2006).
Hu, X et al., Regulation of silk material structure by temperature-controlled water vapor annealing, Biomacromolecules 12: 1686-1696 (2011).
Hu, X. et al., Dynamic protein-water relationships during β-sheet formation. Micromolecules 41: 3939-3948 (2008).
International Search Report for PCT/US2014/029571, 5 pages (dated Dec. 23, 2014).
International Search Report for PCT/US2014/029598, 6 pages (dated Jul. 10, 2014).
Jin, H-J. et al., Water-Stable Silk Films with Reduced β-Sheet Content, Adv. Funct. Mater. 15:1241-1247 (2005).
Jin, H.J, and Kaplan, D.L, Mechanism of silk processing in insects and spiders, Nautre 424:1057-1061 (2003).
Johnson, S.G. & Joannopoulos, J.D. Block-iterative frequency-domain methods for Maxwell's equations in a planewave basis. Opt. Express 8(3):173-190 (2001).
Kikuchi, Y. et al., Structure of the Bombyx mori fibroin light-chain-encoding gene: upstreme sequence elements common to the light and heavy chain, Gene 110: 151-158 (1992).
Kim, D.H. et al., Dissolvable films of silk fibroin for ultrathin conformal bio-integrated electronics, Nature Mater. 9(6): 511-517 (2010).
Kim, S. et al., Fiber-coupled surface-emitting photonic crystal band edge laser for biochemical sensor applications. Appl. Phys. Lett. 94: 133503 (2009).
Kim, S. et al., Silk inverse opals. Nature Photon. 6: 818-823 (2012).
Kim, U-J. et al., Structure and Properties of Silk Hydrogels, Biomacromol., 5:786-792 (2004).
Kojthung, A. et al., Effects of gamma radiation on biodegradation of Bombyx mori silk. fibroin. Int. Biodeterioration & Biodegradation 62: 487-490 (2008).
Lawrence, B.D. et al., Bioactive Silk Protein Biomaterial Systems for Optical Devices., Biomacromolecules 9: 1214-1220 (2008).
Liu, J et al., Radiation grafting/crosslinking of silk using electron-beam irradiation. J. Appl. Poly. Sci. 91: 2028-2034 (2004).
Lu, Q. et al., Stabilization and release of enzymes from silk films, Macromol. Biosci., 10(4):359-68 (2010).
Lucas et al., The Silk Fibroins, Adv. Potein Chem. 13: 107-242 (1958).
Martiradonna, L.et al., Lithiographic nano-patterning of colloidal nanocrystal emitters for the fabrication of waveguide photonic devices. Sens. Act. B 126: 116-119 (2007).
Mondia J.P. et al., Rapid nanoimprinting of doped silk films for enhanced flourescent emission. Adv. Mater. 22: 4596-4599 (2010).
Nazarov, R. et al., Porous 3-D Scaffolds from Regenerated Silk Fibroin., Biomacromolecules 5: 718-726 (2004).
Omenetto, F.G. and Kaplan, D., A new route for silk, Nature Photonics 2: 641-643 (2008).
Omentetto, F.G. and Kaplan, D.L., New Opportunities for an ancient material, Scienec. 329: 528-531 (2010).
Parker et al., Biocompatible Silk Printed Optical Waveguides, Adv. Mater. 21:1-5 (2009).
Pedelacq, J.-D. et al., Engineering and characterization of a superfolder green flourescent protein., Nature Biotech. 24(1): 79-88 (2005).
Perry, H. et al., Nano- and micropatterning of opitcally transparent, mechanically robust, biocompatible silk fibroin films. Adv. Mater 20:3070-3072 (2008).
Pritchard, E.M, et al., Physical and chemical aspects of stabilization of compounds in silk, Biopolymars 97(6): 479-498 (2012).
Solak, H.H. et al., Multiple-beam interference lithography with electron beam written gratings. J. Vac. Sci & Technol. B 20: 2844-2848 (2002).
Takei, F. et al., Further Evidence for Importance of the Subunit Combination of Silk Fibroin in its Efficient secretion from the Posterior Silk Gland Cells, J Cell Biol. 105: 175-180 (1987).
Tan, Y. et al., Gold-nanoparticle-infiltrated polystyrene inversopals: A Three-dimensional platform for generating combined optical properties. Chem. Mater 18(15): 3385-3389 (2006).
Tanaka, K. et al., Determination of the site of disulfide linkage between heavy and light chains of silk fibroin produced by Bombyx mori, Biochim. Biophys. Acta 1432: 92-103 (1999).
Tanaka, K. et al., Immunological Identification of the Major Disulfide-Linked Light Component of Silk Fibroin, J. Biochem 114(1): 1-4 (1993).
Tao, H. et al., Silk Materials—A road to sustainable high technology, Adv. Mater. 24(21)L 2824-2837 (2012).
Tarhan, I.I. and Watson, G.H, Photonic band Structure of fcc colloidal crystals, Phys. Rev. Lett. 76(2): 315-318 (1996).
Tearney, G.J. et al., In vivo endoscopic optical biopsy with optical coherence tomography, Science 276(5321): 2037-2039 (1997).
Tsioris, K. et al., Rapid Transfer-based micropatterning and dry etching of silk microstructures, Adv. Mater. 23(17): 2015-2019 (2011).
Valluzzi, R., et al., Orientation of silk III at the air-water interface, Int. J. Biol. Macromol., 24(2-3): 237-242 (1999).
Written Opinion for PCT/US2014/029571, 7 pages (dated Dec. 23, 2014).
Written Opinion for PCT/US2014/029598, 6 pages (dated Jul. 10, 2014).
Zhou et al., Fine Organization of Bombyx mori fibroin heavy chain gene, Nucl. Acids Res. 28(12): 2413-2419 (2000).
Jones, R.A. et al., Direct write electron beam patterning of DNA complex thin films., J.Vac. Sci., Technol. B26, 2567 (2008).

* cited by examiner (a)

Positive (b)

Negative 20 nm feature, but unclear pattern 50 nm feature 57 nm and 71 nm in SEM Thickness of a silk film ~160 nm 30 nm feature 35 nm and
33 nm in SEM 20 nm feature 25 nm in SEM

SEQUENCE LISTING

<160> NUMBER OF SEQ ID NOS: 22

<210> SEQ ID NO 1
<211> LENGTH: 90
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (7)..(90)
<223> OTHER INFORMATION: Wherein any of residues 7-90 may be missing.

<400> SEQUENCE: 1

Gly Ala Gly Ala Gly Ser Gly Ala Gly Ala Gly Ser Gly Ala Gly Ala
1               5                   10                  15

Gly Ser Gly Ala Gly Ala Gly Ser Gly Ala Gly Ala Gly Ser Gly Ala
            20                  25                  30

Gly Ala Gly Ser Gly Ala Gly Ala Gly Ser Gly Ala Gly Ala Gly Ser
        35                  40                  45

Gly Ala Gly Ala Gly Ser Gly Ala Gly Ala Gly Ser Gly Ala Gly Ala
    50                  55                  60

Gly Ser Gly Ala Gly Ala Gly Ser Gly Ala Gly Ala Gly Ser Gly Ala
65                  70                  75                  80

Gly Ala Gly Ser Gly Ala Gly Ala Gly Ser
            85                  90

<210> SEQ ID NO 2
<211> LENGTH: 30
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (2)..(2)
<223> OTHER INFORMATION: Wherein X is V, I or A.
<220> FEATURE:
<221> NAME/KEY: MISC_FEATURE
<222> LOCATION: (3)..(30)
<223> OTHER INFORMATION: Wherein any of residues 3-30 may be missing
<220> FEATURE:
<221> NAME/KEY: MISC_FEATURE
<222> LOCATION: (4)..(4)
<223> OTHER INFORMATION: Wherein X is V, I or A.
<220> FEATURE:
<221> NAME/KEY: MISC_FEATURE
<222> LOCATION: (6)..(6)
<223> OTHER INFORMATION: Wherein X is V, I or A.
<220> FEATURE:
<221> NAME/KEY: MISC_FEATURE
<222> LOCATION: (8)..(8)
<223> OTHER INFORMATION: Wherein X is V, I or A.
<220> FEATURE:
<221> NAME/KEY: MISC_FEATURE
<222> LOCATION: (10)..(10)
<223> OTHER INFORMATION: Wherein X is V, I or A.
<220> FEATURE:
<221> NAME/KEY: MISC_FEATURE
<222> LOCATION: (12)..(12)
<223> OTHER INFORMATION: Wherein X is V, I or A.
<220> FEATURE:
<221> NAME/KEY: MISC_FEATURE
<222> LOCATION: (14)..(14)
<223> OTHER INFORMATION: Wherein X is V, I or A.
<220> FEATURE:
<221> NAME/KEY: MISC_FEATURE
<222> LOCATION: (16)..(16)
<223> OTHER INFORMATION: Wherein X is V, I or A.

```
<220> FEATURE:
<221> NAME/KEY: MISC_FEATURE
<222> LOCATION: (18)..(18)
<223> OTHER INFORMATION: Wherein X is V, I or A.
<220> FEATURE:
<221> NAME/KEY: MISC_FEATURE
<222> LOCATION: (20)..(20)
<223> OTHER INFORMATION: Wherein X is V, I or A.
<220> FEATURE:
<221> NAME/KEY: MISC_FEATURE
<222> LOCATION: (22)..(22)
<223> OTHER INFORMATION: Wherein X is V, I or A.
<220> FEATURE:
<221> NAME/KEY: MISC_FEATURE
<222> LOCATION: (24)..(24)
<223> OTHER INFORMATION: Wherein X is V, I or A.
<220> FEATURE:
<221> NAME/KEY: MISC_FEATURE
<222> LOCATION: (26)..(26)
<223> OTHER INFORMATION: Wherein X is V, I or A.
<220> FEATURE:
<221> NAME/KEY: MISC_FEATURE
<222> LOCATION: (28)..(28)
<223> OTHER INFORMATION: Wherein X is V, I or A.
<220> FEATURE:
<221> NAME/KEY: MISC_FEATURE
<222> LOCATION: (30)..(30)
<223> OTHER INFORMATION: Wherein X is V, I or A.

<400> SEQUENCE: 2

Gly Xaa Gly Xaa Gly Xaa Gly Xaa Gly Xaa Gly Xaa Gly Xaa Gly Xaa
1               5                   10                  15

Gly Xaa Gly Xaa Gly Xaa Gly Xaa Gly Xaa Gly Xaa Gly Xaa
            20                  25                  30

<210> SEQ ID NO 3
<211> LENGTH: 4
<212> TYPE: PRT
<213> ORGANISM: Bombyx mori

<400> SEQUENCE: 3

Gly Ala Ala Ser
1

<210> SEQ ID NO 4
<211> LENGTH: 15
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (2)..(2)
<223> OTHER INFORMATION: Wherein residue S may be missing
<220> FEATURE:
<221> NAME/KEY: MISC_FEATURE
<222> LOCATION: (14)..(15)
<223> OTHER INFORMATION: Wherein any of residues 14-15 may be missing

<400> SEQUENCE: 4

Ser Ser Ala Ala Ala Ala Ala Ala Ala Ala Ala Ala Ala Ala Ala
1               5                   10                  15

<210> SEQ ID NO 5
<211> LENGTH: 8
<212> TYPE: PRT
<213> ORGANISM: Artificial sequence
<220> FEATURE:
<223> OTHER INFORMATION: Synthetic polypeptide
```

```
<220> FEATURE:
<221> NAME/KEY: MISC_FEATURE
<222> LOCATION: (2)..(5)
<223> OTHER INFORMATION: Wherein any of residues 2-5 may be missing
<220> FEATURE:
<221> NAME/KEY: MISC_FEATURE
<222> LOCATION: (2)..(2)
<223> OTHER INFORMATION: Wherein X is any residue
<220> FEATURE:
<221> NAME/KEY: MISC_FEATURE
<222> LOCATION: (3)..(3)
<223> OTHER INFORMATION: Wherein X is any residue
<220> FEATURE:
<221> NAME/KEY: MISC_FEATURE
<222> LOCATION: (4)..(4)
<223> OTHER INFORMATION: Wherein X is any residue
<220> FEATURE:
<221> NAME/KEY: MISC_FEATURE
<222> LOCATION: (5)..(5)
<223> OTHER INFORMATION: Wherein X is any residue
<220> FEATURE:
<221> NAME/KEY: MISC_FEATURE
<222> LOCATION: (8)..(8)
<223> OTHER INFORMATION: Wherein X is any residue

<400> SEQUENCE: 5

Gly Xaa Xaa Xaa Xaa Gly Gly Xaa
1               5

<210> SEQ ID NO 6
<211> LENGTH: 4
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (4)..(4)
<223> OTHER INFORMATION: Wherein X is A, S, Y, R, D, V or W

<400> SEQUENCE: 6

Gly Gly Gly Xaa
1

<210> SEQ ID NO 7
<211> LENGTH: 12
<212> TYPE: PRT
<213> ORGANISM: Artificial Sequence
<220> FEATURE:
<223> OTHER INFORMATION: Synthetic polypeptide
<220> FEATURE:
<221> NAME/KEY: MISC_FEATURE
<222> LOCATION: (2)..(2)
<223> OTHER INFORMATION: Wherein residue S may be missing
<220> FEATURE:
<221> NAME/KEY: MISC_FEATURE
<222> LOCATION: (4)..(6)
<223> OTHER INFORMATION: Wherein any residues 4-6 may be missing

<400> SEQUENCE: 7

Ser Ser Ala Ala Ala Ala Ser Ser Ala Ala Ala Ala
1               5                   10

<210> SEQ ID NO 8
<211> LENGTH: 6
<212> TYPE: PRT
<213> ORGANISM: Galleria mellonella

<400> SEQUENCE: 8

Gly Leu Gly Gly Leu Gly
1               5
```

```
<210> SEQ ID NO 9
<211> LENGTH: 6
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (2)..(2)
<223> OTHER INFORMATION: Wherein X is L, I, V or P
<220> FEATURE:
<221> NAME/KEY: MISC_FEATURE
<222> LOCATION: (5)..(5)
<223> OTHER INFORMATION: Wherein X is L, I, V or P

<400> SEQUENCE: 9

Gly Xaa Gly Gly Xaa Gly
1               5

<210> SEQ ID NO 10
<211> LENGTH: 21
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (5)..(5)
<223> OTHER INFORMATION: Wherein X is Y, V, S or A
<220> FEATURE:
<221> NAME/KEY: MISC_FEATURE
<222> LOCATION: (6)..(20)
<223> OTHER INFORMATION: Wherein any of 6-20 may be missing
<220> FEATURE:
<221> NAME/KEY: MISC_FEATURE
<222> LOCATION: (10)..(10)
<223> OTHER INFORMATION: Wherein X is Y, V, S or A
<220> FEATURE:
<221> NAME/KEY: MISC_FEATURE
<222> LOCATION: (15)..(15)
<223> OTHER INFORMATION: Wherein X is Y, V, S or A
<220> FEATURE:
<221> NAME/KEY: MISC_FEATURE
<222> LOCATION: (20)..(20)
<223> OTHER INFORMATION: Wherein X is Y, V, S or A

<400> SEQUENCE: 10

Gly Pro Gly Gly Xaa Gly Pro Gly Gly Xaa Gly Pro Gly Gly Xaa Gly
1               5                   10                  15

Pro Gly Gly Xaa Tyr
            20

<210> SEQ ID NO 11
<211> LENGTH: 5
<212> TYPE: PRT
<213> ORGANISM: Argiope trifasciata

<400> SEQUENCE: 11

Gly Arg Gly Gly Ala
1               5

<210> SEQ ID NO 12
<211> LENGTH: 13
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (5)..(10)
<223> OTHER INFORMATION: Wherein any of 5-10 may be missing
```

<400> SEQUENCE: 12

Gly Ala Gly Ala Ala Ala Ala Ala Ala Gly Gly Ala
1               5                   10

<210> SEQ ID NO 13
<211> LENGTH: 8
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (3)..(3)
<223> OTHER INFORMATION: Wherein X is Q, Y, L, A, S or R
<220> FEATURE:
<221> NAME/KEY: MISC_FEATURE
<222> LOCATION: (5)..(5)
<223> OTHER INFORMATION: Wherein X is Q, Y, L, A, S or R
<220> FEATURE:
<221> NAME/KEY: MISC_FEATURE
<222> LOCATION: (7)..(7)
<223> OTHER INFORMATION: Wherein X is Q, Y, L, A, S or R
<220> FEATURE:
<221> NAME/KEY: MISC_FEATURE
<222> LOCATION: (8)..(8)
<223> OTHER INFORMATION: Wherein X is Q, Y, L, A, S or R

<400> SEQUENCE: 13

Gly Gly Xaa Gly Xaa Gly Xaa Xaa
1               5

<210> SEQ ID NO 14
<211> LENGTH: 16
<212> TYPE: PRT
<213> ORGANISM: Bombyx mori

<400> SEQUENCE: 14

Thr Gly Ser Ser Gly Phe Gly Pro Tyr Val Asn Gly Gly Tyr Ser Gly
1               5                   10                  15

<210> SEQ ID NO 15
<211> LENGTH: 8
<212> TYPE: PRT
<213> ORGANISM: Bombyx mandarina

<400> SEQUENCE: 15

Tyr Glu Tyr Ala Trp Ser Ser Glu
1               5

<210> SEQ ID NO 16
<211> LENGTH: 7
<212> TYPE: PRT
<213> ORGANISM: Antheraea mylitta

<400> SEQUENCE: 16

Ser Asp Phe Gly Thr Gly Ser
1               5

<210> SEQ ID NO 17
<211> LENGTH: 7
<212> TYPE: PRT
<213> ORGANISM: Antheraea yamamai

<400> SEQUENCE: 17

Arg Arg Ala Gly Tyr Asp Arg
1               5

```
<210> SEQ ID NO 18
<211> LENGTH: 8
<212> TYPE: PRT
<213> ORGANISM: Galleria mellonella

<400> SEQUENCE: 18

Glu Val Ile Val Ile Asp Asp Arg
1               5

<210> SEQ ID NO 19
<211> LENGTH: 18
<212> TYPE: PRT
<213> ORGANISM: Nephila madascariensis

<400> SEQUENCE: 19

Thr Thr Ile Ile Glu Asp Leu Asp Ile Thr Ile Asp Gly Ala Asp Gly
1               5                   10                  15

Pro Ile

<210> SEQ ID NO 20
<211> LENGTH: 8
<212> TYPE: PRT
<213> ORGANISM: Nephila clavipes

<400> SEQUENCE: 20

Thr Ile Ser Glu Glu Leu Thr Ile
1               5

<210> SEQ ID NO 21
<211> LENGTH: 6
<212> TYPE: PRT
<213> ORGANISM: Artificial sequence
<220> FEATURE:
<223> OTHER INFORMATION: Synthetic polypeptide

<400> SEQUENCE: 21

Gly Ser Gly Ala Gly Ala
1               5

<210> SEQ ID NO 22
<211> LENGTH: 5
<212> TYPE: PRT
<213> ORGANISM: Artificial sequence
<220> FEATURE:
<223> OTHER INFORMATION: Synthetic polypeptide
<220> FEATURE:
<221> NAME/KEY: MISC_FEATURE
<222> LOCATION: (4)..(4)
<223> OTHER INFORMATION: Wherein X is any residue
<220> FEATURE:
<221> NAME/KEY: MISC_FEATURE
<222> LOCATION: (5)..(5)
<223> OTHER INFORMATION: Wherein X is any residue

<400> SEQUENCE: 22

Gly Pro Gly Xaa Xaa
1               5
```

ALL WATER-BASED NANOPATTERNING

CROSS REFERENCE TO RELATED APPLICATIONS

This patent application is a National Stage Entry of International Patent Application No. PCT/US2014/029571, filed on Mar. 14, 2014; which claims the benefit of and priority to U.S. Provisional Application 61/788,520, filed Mar. 15, 2013 and entitled "ALL WATER-BASED NANOPATTERNING," the entire contents of each of which are incorporated herein by reference.

GOVERNMENT SUPPORT

This invention was made with government support under grant number W911 NF-07-1-0618 awarded by the United States Army. The government has certain rights in the invention.

BACKGROUND

Fabrication of nanostructures with a high degree of control is of great interest. Nanopatterning of polymers, for example, is attractive for a number of fields including biology, chemical engineering, medical science, and the development of nanoelectronics/photonics.

Since its inception over 200 years ago, lithography has been widely utilized as a relatively simple, versatile printing technique. Lithography generally takes advantage of chemicals that repel each other, e.g., a "positive" substance and a "negative" substance. While the technique provides a cost-effective means of producing high resolution printing, the process typically involves the use of highly toxic or hazardous materials, as well as strict waste management.

SUMMARY OF THE INVENTION

The present invention provides, inter alia, novel green lithography techniques. The present invention encompasses the recognition that certain biological materials can be used to replace conventional toxic or volatile substances used as resists (e.g., photoresists) and solvents used in subsequent developing processes in carrying out lithography, thereby rendering the process "green." More specifically, the present disclosure includes the recognition that silk fibroin-based materials can be used as a resist, in lieu of conventional resists, for carrying out high resolution lithography that is cost-effective, easy to use, user-safe and environmentally friendly. In particular, silk fibroin-based electron beam lithography (EBL) techniques described herein can be used for the fabrication of nanostructures at a resolution comparable to that of modern lithography techniques available in the art, all the while using entirely water-based processing.

Among other things, the present application provides a novel use of silk fibroin materials as a natural electron beam resist for EBL. The process is simple and represents an entirely water-based approach to nano-patterning. This is accomplished by directly nano-patterning the silk fibroin protein, utilizing only EBL and water, therefore eliminating unnecessary fabrication steps involving toxic chemicals. Additionally, two-faced patterning ("positive tone" and "negative tone") in a silk is possible with high resolution. Moreover, the ability to easily dope silk with either inorganic and/or organic dopants provides augmented utility by allowing innumerable combinations of functionalized resist to be generated. Using this approach, it is possible to fabricate a wide range of two-dimensional (2D) and three-dimensional (3D) nanostructures, including, without limitation, photonic structures such as photonic crystals (PhCs) and diffractive gratings with nano-scale feature sizes. Thus, silk fibroin-based EBL in accordance with the invention is an attractive way to manufacture products or compositions that require precise nanopatterning or nano-scale topographies. In some embodiments, such products include biophotonic chips.

Essentially, methods described herein take advantage of structural properties of silk fibroin, in that the "ON/OFF" (or "positive/negative") modes of silk fibroin-based resists can be controlled by differential solubility of silk fibroin, depending on the degree of crystallinity of the material. In other words, silk fibroin can be rendered soluble or insoluble, by controlling protein structures at the molecular level.

In the context of the present disclosure, when silk fibroin protein is "immobilized," silk fibroin materials comprising such silk fibroin protein are said to be insoluble in an aqueous environment (e.g., water). On the other hand, when silk fibroin protein is not immobilized, silk fibroin materials comprising such silk fibroin protein are said to be soluble in an aqueous environment (e.g., water). A silk fibroin material can thus be selectively immobilized or selectively not immobilized in a predetermined spatial pattern (e.g., topography). This allows portions of the silk fibroin material corresponding to immobilized silk fibroin to be rendered insoluble in water, and such portions of the silk fibroin material will withstand water treatment without dissolving. Portions of the silk fibroin material that are not immobilized are soluble and therefore may easily be washed away (or dissolved) with the use of a water-based agent, such as de-ionized water or an appropriate buffer, in so-called the "developing" step in carrying out lithography. As described in further details herein, the process can be controlled at the nano-scale level, allowing fabrication of nanostructures that correspond to portions of silk fibroin that are selectively immobilized or not immobilized.

As the examples demonstrate, such nanostructures fabricated by green methods in accordance with the present application have a degree of resolution and aspect ratio comparable to those prepared by conventional EBL techniques.

Utility and feasibility of the present invention are demonstrated in non-limiting working examples provided in the present application. For example, the present invention demonstrates the versatility of reformulating silk as a doped resist to add utility to materials that operate at the interface between nanotechnology and biology. In some embodiments, such applications include silk-based photonic crystals combined with one or more functional elements that are reactive to light stimulation and augment light-induced effects, including, for example, plasmonic resonance, photosensitive reactions, light emission by quantum dots and fluorescent entities, and so on.

DETAILED DESCRIPTION OF CERTAIN EMBODIMENTS

Figure 1:
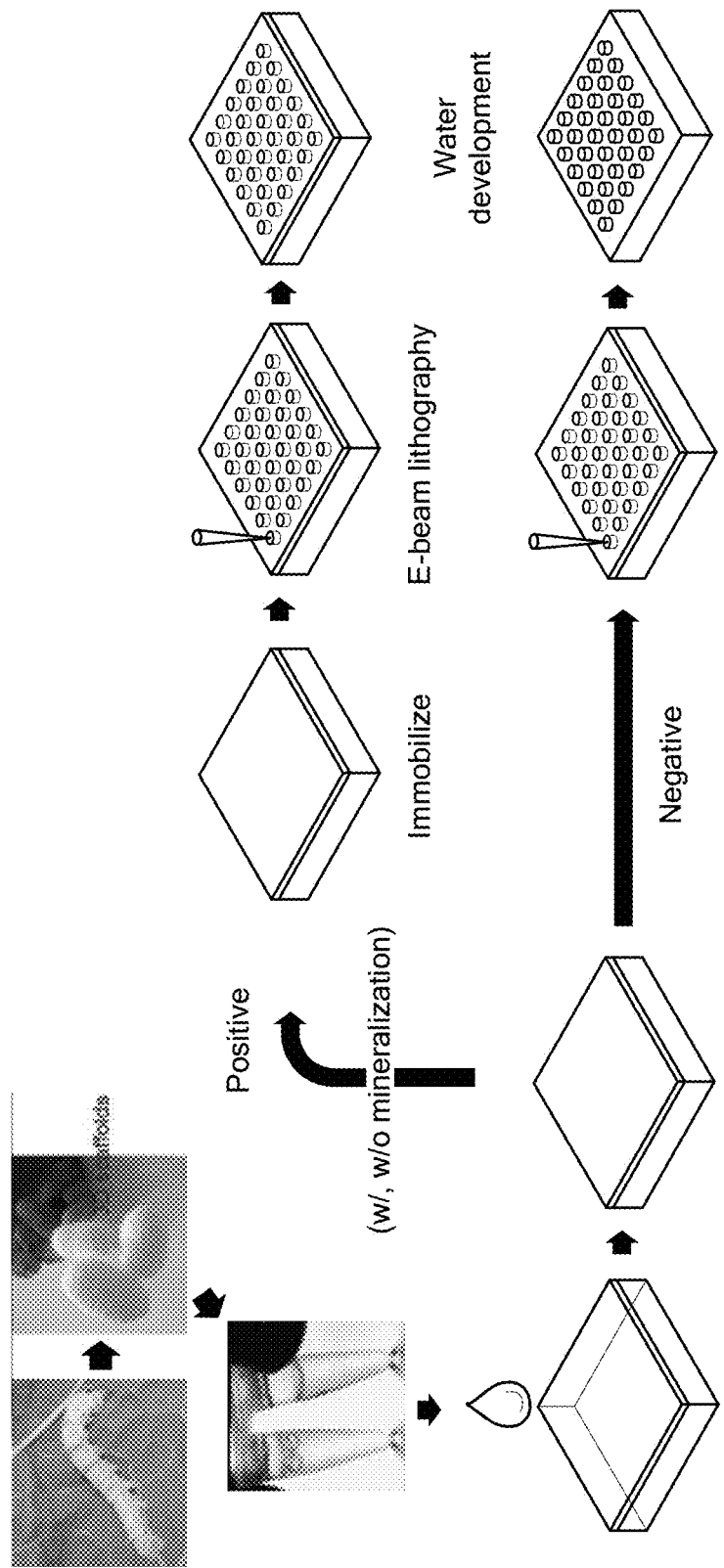
FIG. 1 illustrates working principle of all water-based electron beam patterning on a silk film. Schematics show exemplary fabrication steps of direct nano-patterning on silk fibroin using electron beam lithography (EBL).

The interplay between the electrical and photonic phenomena endogenous to biological matter and the ones externally induced or transduced through technological interfaces has driven developments in understanding natural systems driving new approaches in biosensing and imaging techniques.[1-3] In this context largely aimed at optimizing the interface between technology and biology, the ability to carry out micro- and nanofabrication becomes critical factor needed for designing, replicating, producing and reproducing functional electrical and/or optical interfaces.

Silk fibroin, including the natural protein extracted from the Bombyx mori caterpillar, has been shown to be an attractive material for applications in bio-electronics and photonics due to its biocompatibility and unique mechanical and optical characteristics.[4, 5] The favorable characteristics of silk fibroin films afford the adaptation of micro- and nano-fabrication techniques commonly used in organic electronics and photonics manufacturing.[6] Silk fibroin-based materials embody the interface between technology and biology by complementing their material traits with the ability to be a biologically favorable carrier, in which bio-dopants such as biologics and other biologically active agents and therapeutics maintain their function.[7]

Silk-based nanoimprinting has been described. Water-based silk solution extracted from natural silk fibers can be used as a precursor that can be cast on various micro- and nano-structured molds, faithfully replicating their topographies.[8, 9] Nanoimprinting has been used to fabricate two dimensional photonic crystal (PhC) with feature sizes under 50 nm.[10] Additionally, microscale metal-patterns were successfully transferred to silk films and used as an etching mask or as conformal electrodes.[11, 12] However, most micro- and nano-fabrication techniques for generating desired patterns in silk fibroin-based materials or other polymers demand non-trivial fabrication steps involving the use of toxic chemicals or limit freedom of the pattern's diversity. Still, ultrahigh resolution electron-beam lithography (EBL) has promising applications in bit-patterned media for high resolution template and nanoelectronic/photonic devices. These merits may also be applicable to the polymers and its use for the functionalized device. For example, an waveguide were demonstrated by direct EBL to quantum dot (QD)-doped poly(methyl methacrylate) (PMMA).[13] And biomaterials such as DNA and poly(ethylene glycol) were used as resists for EBL even though these materials used toxic chemicals to obtain high resolution.[14,15]

The present invention combines the advantageous features of EBL and unique material properties of silk fibroin in realizing truly green nanopatterning. In a broad sense, silk fibroin-based green lithography methods described herein are based on selective "ON-OFF" control of silk fibroin materials, conferred by differential solubility of the materials to water. When silk fibroin in the material is immobilized (e.g., annealed, crosslinked, etc.), the silk material is water-insoluble. Portions of silk fibroin material that are not immobilized can be washed away.

Soluble Vs. Insoluble Silk Fibroin

According to the present invention, the crystallinity of silk fibroin can be controlled at the nano-scale to provide either "soluble" or "insoluble" form of silk fibroin materials. This forms a general basis for the lithography methods described herein, in which silk resist (e.g., silk fibroin materials) is used for selective solubilization (or selective immobilization) in a predetermined spatial pattern at the micro- or nano-scale. Such silk resist can then be "developed" by a washing step so as to "wash away" or dissolve soluble portions of the silk resist. Insoluble or immobilized portions of silk resist remain intact. Using such techniques, high-resolution, highly reproducible, inexpensive methods involving EBL can be carried out using an entirely water-based process.

As described in more detail herein, in the context of the present disclosure, the term solubility refers to solubility of a material (such as silk fibroin-based materials) in an aqueous environment (e.g., using aqueous agents, such as water and water-based buffers), unless expressly stated otherwise. The term "insoluble" likewise refers to inability of a material to be soluble or be solubilized in an aqueous environment. From a molecular point of view, an insoluble silk fibroin material is also characterized as "immobilized" in the context of the present disclosure. The term "immobilization" or "immobilizing" does not imply tethering to a support; rather, the term refers to structurally stabilized forms of silk fibroin that are not soluble in water or water-based buffers.

Thus, immobilization occurs through molecular interactions of silk fibroin molecules. For example, immobilization may involve intra- and/or inter-molecular interactions of fibroin molecules present in a silk fibroin material (or silk fibroin-based material). These interaction may comprise non-covalent interactions, such as hydrogen bonds, hydrophobic interactions, ionic interactions, as well as covalent bonds. In some embodiments, any of these interactions may take place in certain portions (or fragments) of silk fibroin molecule. In some embodiments, primarily hydrophobic stretches of the silk fibroin polypeptide mediate hydrophobic interactions, hydrogen bond formations, or both.

Generally, there are at least two mechanistically distinct mechanisms of transforming soluble forms of silk fibroin into insoluble or immobilized forms. The first mechanism is to induce annealing of silk fibroin; the second mechanism is to crosslink (or cross-link) silk fibroin. Each of the mechanisms is briefly discussed below.

Annealing

As used herein, the process of annealing involves increased non-covalent interactions of silk fibroin molecules to induce the formation of beta sheet secondary structures. Such non-covalent interactions may include intra-molecular interactions, inter-molecular interactions, or both. Typically, non-covalent interactions are mediated by hydrogen bonds, as well as hydrophobic interactions of silk fibroin molecules, which are associated with increased beta sheet formation. Upon reaching a certain critical level of beta sheet content, silk fibroin is rendered insoluble in an aqueous condition. This phenomenon is generally associated with greater crystallinity, and the status of such silk fibroin is referred to as the Silk II structure. Thus, "annealing" involves non-covalent interactions (e.g., the hydrogen bonds, hydrophobic interactions, etc.), which favor structural shift of silk fibroin into higher beta sheet content, such that silk fibroin is crystalized and thus made insoluble.

There are at least three ways to induce or promote annealing. One is to subject silk fibroin to dehydration by the use of organic solvent(s), such as alcohols, e.g., methanol, ethanol, isopropyl, acetone, etc. Such solvents have an effect of dehydrating silk fibroin, which promotes "packing" of silk fibroin molecules to favor the formation of beta sheet structures.

A second way to induce annealing involves plasticizing silk fibroin. In some embodiments, plasticizing can be achieved by treating solidified but soluble forms of silk fibroin with a plasticizing agent. In some embodiments, such plasticizing agent is water vapor. Water molecules of water vapor are thought to act as a plasticizer, which allows increased chain mobility of fibroin molecules to promote the formation of hydrogen bonds, leading to increased beta sheet secondary structures.

A third novel means of annealing involves slow, controlled evaporation of water from silk fibroin. For this process to occur, a silk fibroin solution or hydrolyzed silk fibroin material is allowed to evaporate at a low rate, often over hours or days. To ensure slow evaporation, such silk materials may be placed in a substantially closed chamber or container, in which the moisture content in the surrounding environment (e.g., humidity) is maintained relatively high. In this way, the rate of evaporation from the silk materials can be retarded. In some embodiments, evaporation is allowed to occur at a humidity ranging between about 40% and 100%, e.g., about 40%, about 45%, about 50%, about 55%, about 60%, about 65%, about 70%, about 75%, about 80%, about 85%, about 90%, about 95%, and about 100%. It is contemplated that slow evaporation of water molecules from a silk fibroin material allows slow, more orderly "packing" of fibroin molecules into beta sheet structure, as compared to silk fibroin that is allowed to evaporate more rapidly at the same temperature, which leads to a higher degree of disorganization in the resulting silk fibroin structures upon solidification. Orderly packing means greater crystallinity of silk fibroin.

Whether annealing is achieved by the use of an organic solvent (e.g., methanol) or by water vapor treatment, alternatively by slow evaporation, the end result is that annealed silk fibroin exhibits high degrees of crystallinity such that it becomes water-insoluble. In some embodiments, "high degrees of crystallinity" refers to beta sheet contents of between about 20% and about 80%, e.g., about 20%, about 25%, about 30%, about 35%, about 40%, about 45%, about 50%, about 55%, about 60%, about 65% and about 75%, or greater.

Crosslinking

As used herein, the term "crosslinking" (or "cross-linking") refers to the formation of covalent bonds involving silk fibroin molecules. Crosslinking can immobilize silk fibroin molecules such that crosslinked silk fibroin material is insoluble in water. Unlike the process of annealing, however, this mode of immobilization does not depend on the formation of beta sheet structures in silk fibroin. Rather, crosslinked silk fibroin molecules are "fixed in place" so-to-speak, via covalent bonds. In some embodiments, the process of crosslinking involves the formation of free radicals. In some embodiments, the process of crosslinking preferentially affects certain amino acid residues of silk fibroin polypeptides. In some embodiments, the process of crosslinking preferentially affects tyrosine residues of silk fibroin polypeptides. In some embodiments, the process of crosslinking involves tyrosyl radicals. In some embodiments, crosslinking is induced in silk fibroin comprising extra tyrosine residues, as compared to the native (or wild type) silk fibroin polypeptide sequence. In some embodiments, recombinantly produced silk fibroin is used for crosslinking. In some embodiments, silk fibroin is enriched with hydrophobic fragments of the silk fibroin polypeptide. In some embodiments, crosslinking comprises the use of at least one crosslinking agents, such as polymers and linkers. In some embodiments, such crosslinking agents form covalent bonds with silk fibroin molecules via reactive groups.

As already stated, the basic premise underlining the present invention is the ability to control the ON/OFF states of silk fibroin resists by manipulating its solubility. Based on this principle, two modes of silk fibroin-based green lithography are described herein: (i) the negative tone; and, (ii) the positive tone. As discussed below, the former involves selective removal of portion of silk resist, while the latter involves selective formation of immobilized portion of on otherwise soluble silk resists.

Positive Tone ("Subtractive" Method)

As already alluded to, in the "positive" mode, an immobilized silk fibroin material is used to selectively solubilize at least a portion of the material to create corresponding structures (e.g., voids) upon such a material. In some embodiments, the process involves electron beam lithography using immobilized or insoluble silk fibroin as a starting material (such as silk fibroin layer or film) which acts as a resist. Electron beam can be used for precise control of exposure upon the silk resist. Electron beam causes the breakage of weak non-covalent bonds, such as hydrogen bonds, in silk fibroin molecules, rendering the exposed portion water-soluble. Following the electron beam exposure, the silk fibroin material can then be "developed" by a simple washing step. The exposed portion is now dissolved and washed away, while leaving the unexposed portions of the silk fibroin materials intact. Because electron beam allows a nano-scale control, nanostructures may be fabricated on silk fibroin resist at high resolutions.

Negative Tone ("Additive" Method)

Conversely, in the negative mode of the methods, at least a portion of silk fibroin material is selectively immobilized to make it insoluble. In some embodiments, a silk fibroin material is provided which is solidified but water-soluble form of silk fibroin material. In some embodiments, such silk fibroin materials may be a silk fibroin film which has not been annealed, thus substantially water-soluble. At least a portion of such solidified silk fibroin material can be selectively immobilized in a predetermined spatial pattern by any suitable means. The resulting "chimeric" silk fibroin material comprises at least a portion where silk fibroin is immobilized at the molecular level, and at least a portion where silk fibroin is not immobilized at the molecular level. In some embodiments, selective immobilization of the predetermined portion of silk fibroin material is carried out by the use of a high energy source, including but are not limited to irradiation, electron beam, etc. Without wishing to be bound by any particular mechanism, it is suggested that such high energy source can cause free radical generation of certain amino acid side chains of fibroin molecules, including tyrosine residues, resulting in the formation of covalent bonds, herein generally referred to as "crosslinking." In some embodiments, crosslinking of silk fibroin is induced by exposing silk fibroin materials to electron beam. In some embodiments, crosslinking of silk fibroin is induced by irradiation. In some embodiments, crosslinking of silk fibroin comprises photo-crosslinking. In some embodiments, crosslinking of silk fibroin comprises exposing silk fibroin materials to UV (e.g., UV crosslinking) In some embodiments, crosslinking of silk fibroin is achieved by the use of at least one type of chemical linker.

Nanostructures

Using methods described herein, a variety of nanostructures may be fabricated, having a range of sizes, dimensions, shapes, patterns, and so on.

In some embodiments, nanostructures fabricated by any method described herein are substantially two-dimensional structures. "Substantially two-dimensional" means that the depth (e.g., height) of the structure is insignificant such that the structure is predominantly planer, which can be defined by its x-y configuration (area) of the structure. "Substantially three-dimensional" means that the depth (or height) of the structure is a meaningful feature, and such a structure may be defined by its x-y-z configuration (volume) of the structure.

In some embodiments, such a structure constitute a substantially cylindrical void or hole.

In some embodiments, the depth dimension of a 3D structure is varied. In some embodiments, a series of EBL processes is performed to fabricate such a 3D structure having a "layered" effect. In some embodiments, such structure is pyramidal.

In some embodiments, nanostructures fabricated by any method described herein comprise a plurality of nanostructures to form a pattern. In some embodiments, a plurality of nanostructures forms a periodic pattern. In some embodiments, a plurality of nanostructures forms an aperiodic pattern.

In some embodiments, nanostructures fabricated by any method described herein comprise photonic crystal. In some embodiments, nanostructures of photonic crystal comprise a plurality of substantially cylindrical voids aligned in a pattern or patterns. In some embodiments, diameters, depth, and/or distribution of such voids may be varied in a predetermined pattern to create structural colors. For example, in some embodiments, distances between adjacent voids (e.g., spacing) can be varied. In some embodiments, additionally or alternatively, diameters of such voids can be varied.

Generally, the distance between features (e.g. holes, or lines) may be measured "center-to-center" but in some embodiments the distance between features may be measured from the edge of one feature to the edge of an adjacent feature. Further, the patent of the features may be rectangular, triangular or circular array, or any other suitable pattern.

In some embodiments, nanostructures fabricated by any method described herein are present at least on one surface. Typically, nanostructures are fabricated on a silk fibroin material in a form of a layer. According to the invention, such silk fibroin layer can have a variety of dimensions and features.

Such silk fibroin layers contemplated in some embodiments include those adhered to a substrate as well as those independent (e.g., either removed from) a substrate, in addition to free-standing silk fibroin materials. First, the thickness of the silk fibroin layer is typically determined by the coating methods and parameters of the silk fibroin solution. For example, high speed spin coating leads to thinner layers, while lower speed spin coating can lead to thicker layers. In some embodiments, the thickness of the silk fibroin layer can be between about 40 nm and about 1000 nm, e.g., about 40 nm, about 50 nm, about 60 nm, about 70 nm, about 80 nm, about 90 nm, about 100 nm, about 150 nm, about 200 nm, about 250 nm, about 300 nm, about 350 nm, about 400 nm, about 450 nm, about 500 nm, and so on. For example, the thickness may be between about 50 and about 100 nm, between about 50 nm and about 150 nm, between about 50 nm and about 200 nm, between about 50 nm and about 250 nm, between about 50 nm and about 300 nm, between about 50 nm and about 400 nm, between about 50 nm and about 500 nm, between about 100 nm and about 200 nm, between about 100 nm and about 250 nm, between about 100 nm and about 300 nm, between about 100 nm and about 400 nm, between about 100 nm and about 500 nm, between about 200 nm and about 250 nm, between about 200 nm and about 300 nm, between about 200 nm and about 400 nm, between about 200 nm and about 500 nm, between about 250 nm and about 300 nm, between about 250 nm and about 350 nm, between about 250 nm and about 400 nm, between about 250 nm and about 500 nm, between about 300 nm and about 400 nm, between about 300 nm and about 500 nm, or between about 400 nm and about 500 nm.

It should be noted that for effective spin coating, it is advantageous to use a silk fibroin solution at a concentration lower than about 4%, more preferably lower than about 3%, lower than about 2.5%, lower than about 2%, lower than about 1.5%, lower than about 1%, e.g., about 0.9%, about 0.8%, about 0.7%, about 0.6%, about 0.5%.

In some embodiments, the silk fibroin nanostructures produced according to any of the methods in this disclosure include a variety of patterned features. For example, the features may be a series of holes with diameters ranging from about 20 nm to about 200 nm. In some embodiments, the diameter may be between about 20 nm and about 30 nm, between about 20 nm and about 50 nm, between about 20 nm and about 100 nm, between about 30 nm and about 100 nm, between about 30 nm and about 200 nm, between about 50 nm and about 100 nm, between about 50 nm and about 200 nm or, between about 100 nm and about 200 nm. In some embodiments, the diameter is expressed as a ratio or proportion of the distance between features in a pattern (e.g., the lattice constant, $\Lambda$,). In some embodiments, the diameter is between about $0.1\Lambda$ and about $0.5\Lambda$ (e.g, one tenth or one half of the distance between features, respectively).

Though such features may commonly be described as holes, they have any varying depth, from a few nanometers from the surface of the silk biopolymer layer to penetrating through the entire thickness of silk fibroin layer. Furthermore, the cross-sectional shape of a feature, though commonly described as a hole, implying a circular or elliptical cross-sectional shape, the features may instead by any cross-sectional shape (e.g., rectangular, hexagonal, elongated, or line). Further, the cross-sectional shape of a feature may vary with depth depending on the application or process parameters in patterning. In instances in which the cross-section shape of a feature is not circular, the diameters described above may related to a primary dimension of the feature (e.g. major/minor axis, diagonal, width, etc.,).

The patterns formed can vary. Though generally arrays of features, the patterns can ordered or random. In some embodiments, the ordered arrays can be rectangular, square, triangular or circular, depending on the use of the patterned silk product.

Further, the features may be spaced apparent from each other at regular intervals. The spacing between features may vary from between about 50 nm to about 1000 nm (i.e. 1 µm). For example, the distance between features may be between about 50 nm and about 100 nm, between about 50 nm and about 300 nm, between about 50 nm and about 500 nm, between about 100 nm and about 200 nm, between about 100 nm and about 500 nm, between about 200 nm and about 300 nm, between about 200 nm and about 500 nm, between about 200 nm and about 1000 nm, between about 300 nm and about 500 nm, between about 300 nm and about 1000 nm, between about 500 nm and about 1000 nm. Typically, in the context of photonic crystals, the distance between features is referred to as the lattice constant and given the symbol $\Lambda$.

The diameters and distance between holes/voids of a nanopattern are key determinant factors to colors to be generated. See for example, PCT/US2012/068046, which is incorporated herein by reference in its entirety.

Silk Fibroin

Silk fibroin useful for carrying out the present invention includes a wide variety of silk fibroin polypeptide, fragments thereof, including preparations extracted from native sources, produced recombinantly, or chemically synthesized.

Fibroin is a type of structural protein produced by certain spider and insect species that produce silk. Silk fibers, such as those produced by silkworms or spiders, can be processed into silk fibroin which can then be processed into various forms including silk solutions (Jin & Kaplan, 424 Nature 1057 (2003)), gels (Jim et al., 5 Biomacromol. 786 (2004)), foams (Nazarov et al., 5 Biomacromol. 718 (2004)), and films (Jin et al., 15 Adv. Functional Mats. 1241 (2005); Amsden et al., 17 Optics Express 21271 (2009)). Various processing options enable its use as a supporting and packaging material for implanted micro and medical devices. In addition, silk fibroins matrices have outstanding biocompatibility, and excellent mechanical and optical properties, which make these materials well suited for a variety of implantable medical devices (IMDs). See, for example, Omenetto & Kaplan, 2 Nature Photonics 641 (2008). Additionally, silk films can be patterned (in both 2D and 3D) to realize a number of optical elements such as diffractive gratings (Amsden et al., 22 Adv. Mats. 1746 (2010)), and wave guides (Parker et al., 21 Adv. Mats. (2009)), within the IMDs. Silk fibroins also provide a biologically favorable microenvironment that allow to entrainment of various biological and/or chemical dopants and maintain their functionality. Proteins (Bini et al., 335 J. Mol. Bio. 27 (2004)), enzymes (Lu et al., 10 Macromol. Biosci. 359 (2010)) and small organics (Lawrence et al., 9 Biomacromol. 1214 (2008)), have been incorporated into silk films for various biochemical functionalities.

Additionally, silk fibroin can be prepared in an all-aqueous process, further expanding its compatibility with biologics, manufacturing processes and the environment.

As used herein, the term "silk fibroin" includes silkworm fibroin and insect or spider silk protein. See e.g., Lucas et al., 13 Adv. Protein Chem. 107 (1958). For example, silk fibroin useful for the present invention may be that produced by a number of species, including, without limitation: *Antheraea mylitta; Antheraea pernyi; Antheraea yamamai; Galleria mellonella; Bombyx mori; Bombyx mandarins; Galleria mellonella; Nephila clavipes; Nephila senegalensis; Gasteracantha mammosa; Argiope aurantia; Araneus diadematus; Latrodectus geometricus; Araneus bicentenarius; Tetragnatha versicolor; Araneus ventricosus; Dolomedes tenebrosus; Euagrus chisoseus; Plectreurys tristis; Argiope trifasciata*; and *Nephila madagascariensis*.

In general, silk fibroin for use in accordance with the present invention may be produced by any such organism, or may be prepared through an artificial process, for example, involving genetic engineering of cells or organisms to produce a silk protein and/or chemical synthesis. In some embodiments of the present invention, silk is produced by the silkworm, *Bombyx mori*.

As is known in the art, silks are modular in design, with large internal repeats flanked by shorter (~100 amino acid) terminal domains (N and C termini). Silks have high molecular weight (200 to 350 kDa or higher) with transcripts of 10,000 base pairs and higher and >3000 amino acids (reviewed in Omenetto and Kaplan (2010) Science 329: 528-531). The larger modular domains are interrupted with relatively short spacers with hydrophobic charge groups in the case of silkworm silk. N- and C-termini are involved in the assembly and processing of silks, including pH control of assembly. The N- and C-termini are highly conserved, in spite of their relatively small size compared with the internal modules. An exemplary list of silk-producing species and corresponding silk proteins may be found in International Patent Publication Number WO 2011/130335, the entire contents of which are incorporated herein by reference.

Cocoon silk produced by the silkworm, *Bombyx mori*, is of particular interest because it offers low-cost, bulk-scale production suitable for a number of commercial applications, such as textile. Silkworm cocoon silk contains two structural proteins, the fibroin heavy chain (~350 k Da) and the fibroin light chain (~25 k Da), which are associated with a family of nonstructural proteins termed sericin, which glue the fibroin brings together in forming the cocoon. The heavy and light chains of fibroin are linked by a disulfide bond at the C-terminus of the two subunits (Takei, F., Kikuchi, Y., Kikuchi, A., Mizuno, S. and Shimura, K. (1987) J. Cell Biol., 105, 175-180; Tanaka, K., Mori, K. and Mizuno, S. (1993) J. Biochem. (Tokyo), 114, 1-4; Tanaka, K., Kajiyama, N., Ishikura, K., Waga, S., Kikuchi, A., Ohtomo, K., Takagi, T. and Mizuno, S. (1999) Biochim. Biophys. Acta, 1432, 92-103; Y Kikuchi, K Mori, S Suzuki, K Yamaguchi and S Mizuno, Structure of the *Bombyx mori* fibroin light-chain-encoding gene: upstream sequence elements common to the light and heavy chain, Gene 110 (1992), pp. 151-158). The sericins are a high molecular weight, soluble glycoprotein constituent of silk which gives the stickiness to the material. These glycoproteins are hydrophilic and can be easily removed from cocoons by boiling in water.

As used herein, the term "silk fibroin" embraces silk fibroin protein, whether produced by silkworm, spider, or other insect, or otherwise generated (Lucas et al., Adv. Protein Chem., 13: 107-242 (1958)). In some embodiments, silk fibroin is obtained from a solution containing a dissolved silkworm silk or spider silk. For example, in some embodiments, silkworm silk fibroins are obtained, from the cocoon of *Bombyx mori*. In some embodiments, spider silk fibroins are obtained, for example, from *Nephila clavipes*. In the alternative, in some embodiments, silk fibroins suitable for use in the invention are obtained from a solution containing a genetically engineered silk harvested from bacteria, yeast, mammalian cells, transgenic animals or transgenic plants. See, e.g., WO 97/08315 and U.S. Pat. No. 5,245,012, each of which is incorporated herein as reference in its entirety.

Thus, in some embodiments, a silk solution is used to fabricate compositions of the present invention containing fibroin proteins, essentially free of sericins. In some embodiments, silk solutions used to fabricate various compositions of the present invention contain the heavy chain of fibroin, but are essentially free of other proteins. In other embodiments, silk solutions used to fabricate various compositions of the present invention contain both the heavy and light chains of fibroin, but are essentially free of other proteins. In certain embodiments, silk solutions used to fabricate various compositions of the present invention comprise both a heavy and a light chain of silk fibroin; in some such embodiments, the heavy chain and the light chain of silk fibroin are linked via at least one disulfide bond. In some embodiments where the heavy and light chains of fibroin are present, they are linked via one, two, three or more disulfide bonds.

Although different species of silk-producing organisms, and different types of silk, have different amino acid compositions, various fibroin proteins share certain structural features. A general trend in silk fibroin structure is a sequence of amino acids that is characterized by usually alternating glycine and alanine, or alanine alone. Such configuration allows fibroin molecules to self-assemble into a beta-sheet conformation. These "Ala-rich" hydrophobic blocks are typically separated by segments of amino acids with bulky side-groups (e.g., hydrophilic spacers).

In some embodiments, core repeat sequences of the hydrophobic blocks of fibroin are represented by the following amino acid sequences and/or formulae: $(GAGAGS)_{5-15}$ (SEQ ID NO: 1); $(GX)_{5-15}$ (X=V, I, A) (SEQ ID NO: 2); GAAS (SEQ ID NO: 3); $(S_{1-2}A_{11-13})$ (SEQ ID NO: 4); $GX_{1-4}$ GGX (SEQ ID NO: 5); GGGX (X=A, S, Y, R, D V, W, R, D) (SEQ ID NO: 6); $(S1-2A1-4)_{1-2}$ (SEQ ID NO: 7); GLGGLG (SEQ ID NO: 8); GXGGXG (X=L, I, V, P) (SEQ ID NO: 9); GPX (X=L, Y, I); $(GP(GGX)_{1-4} Y)n$ (X=Y, V, S, A) (SEQ ID NO: 10); GRGGAn (SEQ ID NO: 11); GGXn (X=A, T, V, S); $GAG(A)_{6-7}GGA$ (SEQ ID NO: 12); and GGX GX GXX (X=Q, Y, L, A, S, R) (SEQ ID NO: 13).

In some embodiments, a fibroin peptide contains multiple hydrophobic blocks, e.g., 3, 4, 5, 6, 7, 8, 9, 10, 11, 12, 13, 14, 15, 16, 17, 18, 19 and 20 hydrophobic blocks within the peptide. In some embodiments, a fibroin peptide contains between 4-17 hydrophobic blocks. In some embodiments of the invention, a fibroin peptide comprises at least one hydrophilic spacer sequence ("hydrophilic block") that is about 4-50 amino acids in length. Non-limiting examples of the hydrophilic spacer sequences include: TGSSGFGPYVNGGYSG (SEQ ID NO: 14); YEYAWSSE (SEQ ID NO: 15); SDFGTGS (SEQ ID NO: 16); RRAGYDR (SEQ ID NO: 17); EVIVIDDR(SEQ ID NO: 18); TTIIEDLDITIDGADGPI (SEQ ID NO: 19) and TISEELTI (SEQ ID NO: 20).

In certain embodiments, a fibroin peptide contains a hydrophilic spacer sequence that is a derivative of any one of the representative spacer sequences listed above. Such derivatives are at least 75%, at least 80%, at least 85%, at least 90%, or at least 95% identical to any one of the hydrophilic spacer sequences.

In some embodiments, a fibroin peptide suitable for the present invention contains no spacer.

As noted, silks are fibrous proteins and are characterized by modular units linked together to form high molecular weight, highly repetitive proteins. These modular units or domains, each with specific amino acid sequences and chemistries, are thought to provide specific functions. For example, sequence motifs such as poly-alanine (polyA) and polyalanine-glycine (poly-AG) are inclined to be beta-sheet-forming; GXX motifs contribute to 31-helix formation; GXG motifs provide stiffness; and, GPGXX (SEQ ID NO: 22) contributes to beta-spiral formation. These are examples of key components in various silk structures whose positioning and arrangement are intimately tied with the end material properties of silk-based materials (reviewed in Omenetto and Kaplan (2010) Science 329: 528-531).

It has been observed that the beta-sheets of fibroin proteins stack to form crystals, whereas the other segments form amorphous domains. It is the interplay between the hard crystalline segments, and the strained elastic semi amorphous regions, that gives silk its extraordinary properties. Non-limiting examples of repeat sequences and spacer sequences from various silk-producing species are provided in An exemplary list of hydrophobic and hydrophilic components of fibroin sequences may be found in International Patent Publication Number WO 2011/130335, the entire contents of which are incorporated herein by reference.

The particular silk materials explicitly exemplified herein were typically prepared from material spun by silkworm, *B. Mori*. The complete sequence of the *Bombyx mori* fibroin gene has been determined (C.-Z Zhou, F Confalonieri, N Medina, Y Zivanovic, C Esnault and T Yang et al., Fine organization of *Bombyx mori* fibroin heavy chain gene, Nucl. Acids Res. 28 (2000), pp. 2413-2419). The fibroin coding sequence presents a spectacular organization, with a highly repetitive and G-rich (~45%) core flanked by non-repetitive 5' and 3' ends. This repetitive core is composed of alternate arrays of 12 repetitive and 11 amorphous domains. The sequences of the amorphous domains are evolutionarily conserved and the repetitive domains differ from each other in length by a variety of tandem repeats of subdomains of ~208 bp.

The silkworm fibroin protein consists of layers of anti-parallel beta sheets whose primary structure mainly consists of the recurrent amino acid sequence (Gly-Ser-Gly-Ala-Gly-Ala)n (SEQ ID NO: 21). The beta-sheet configuration of fibroin is largely responsible for the tensile strength of the material due to hydrogen bonds formed in these regions. In addition to being stronger than Kevlar, fibroin is known to be highly elastic. Historically, these attributes have made it a material with applications in several areas, including textile manufacture.

Fibroin is known to arrange itself in three structures at the macromolecular level, termed silk I, silk II, and silk III, the first two being the primary structures observed in nature. The silk II structure generally refers to the beta-sheet conformation of fibroin. Silk I, which is the other main structure of silk fibroin, is a hydrated structure and is considered to be a necessary intermediate for the preorganization or prealignment of silk fibroin molecules. In the nature, silk I structure is transformed into silk II structure after spinning process. For example, silk I is the natural form of fibroin, as emitted from the Bombyx mori silk glands. Silk II refers to the arrangement of fibroin molecules in spun silk, which has greater strength and is often used commercially in various applications. As noted above, the amino-acid sequence of the β-sheet forming crystalline region of fibroin is dominated by the hydrophobic sequence. Silk fibre formation involves shear and elongational stress acting on the fibroin solution (up to 30% wt/vol.) in the gland, causing fibroin in solution to crystallize. The process involves a lyotropic liquid crystal phase, which is transformed from a gel to a sol state during spinning—that is, a liquid crystal spinning process. Elongational flow orients the fibroin chains, and the liquid is converted into filaments.

Silk III is a newly discovered structure of fibroin (Valluzzi, Regina; Gido, Samuel P.; Muller, Wayne; Kaplan, David L. (1999). "Orientation of silk III at the air-water interface". International Journal of Biological Macromolecules 24: 237-242). Silk III is formed principally in solutions of fibroin at an interface (i.e. air-water interface, water-oil interface, etc.). Silk can assemble, and in fact can self-assemble, into crystalline structures. Silk fibroin can be fabricated into desired shapes and conformations, such as silk hydrogels (WO2005/012606; PCT/US08/65076), ultrathin films (WO2007/016524), thick films, conformal coatings (WO2005/000483; WO2005/123114), foams (WO 2005/012606), electrospun mats (WO 2004/000915), microspheres (PCT/US2007/020789), 3D porous matrices (WO2004/062697), solid blocks (WO2003/056297), microfluidic devices (PCT/US07/83646; PCT/US07/83634), electro-optical devices (PCT/US07/83639), and fibers with diameters ranging from the nanoscale (WO2004/000915) to several centimeters (U.S. Pat. No. 6,902,932). The above mentioned applications and patents are incorporated herein by reference in their entirety. For example, silk fibroin can be processed into thin, mechanically robust films with excellent surface quality and optical transparency, which provides an ideal substrate acting as a mechanical support for high-technology materials, such as thin metal layers and contacts, semiconductor films, dielectric powders, nanoparticles, and the like. These unique physiochemical properties of silk allows its use in a variety of applications such as those described herein. Furthermore, useful silk materials can be prepared through processes that can be carried out at room temperature and are water-based. Therefore, bio-molecules of interest can be readily incorporated into silk materials.

While a number of types of silk fibroin, such as those exemplified above, may be used to practice the claimed invention, silk fibroin produced by silkworms, such as Bombyx mori, is the most common and represents an earth-friendly, renewable resource. For instance, silk fibroin may be attained by extracting sericin from the cocoons of B. mori. Organic silkworm cocoons are also commercially available. There are many different silks, however, including spider silk (e.g., obtained from Nephila clavipes), transgenic silks, genetically engineered silks, such as silks from bacteria, yeast, mammalian cells, transgenic animals, or transgenic plants (see, e.g., WO 97/08315; U.S. Pat. No. 5,245,012), and variants thereof, that may be used. As already noted, an aqueous silk fibroin solution may be prepared using techniques known in the art. Suitable processes for preparing silk fibroin solution are disclosed, for example, in U.S. patent application Ser. No. 11/247,358; WO/2005/012606; and WO/2008/127401. The silk aqueous solution can then be processed into silk matrix such as silk films, conformal coatings or layers, or 3-dimensional scaffolds, or electrospun fibers. A microfiltration step may be used herein. For example, the prepared silk fibroin solution may be processed further by centrifugation and syringe based microfiltration before further processing into silk matrix.

Substrates

As noted above, silk fibroin-based electron beam lithography described herein may optionally employ a substrate, upon which a silk resist may be deposited. While not required, a substrate may provide a benefit of structural support, improved handling during manufacture and/or printing process, etc. A variety of materials may be suitable as a substrate. Examples of suitable substrates include, but are not limited to: paper, fabric, silicon, metal, organic and inorganic polymers, and so on.

In some embodiments, useful substrates may be rigid. In some embodiments, useful substrates may be malleable. In some embodiments, useful substrates may be flat. In some embodiments, useful substrates may be conforming. In some embodiments, a substrate itself comprises a silk fibroin material, e.g., a film, a block, a thread, a particle, a mesh, an object or an article.

Electron Beam Lithography, Generally

Electron beam lithography (EBL) is a form of maskless lithography which fabricates arbitrary patterns by a serial writing without the use of masks. Such process creates patterns in a serial manner that allows an ultrahigh-resolution patterning of arbitrary shapes with a minimum feature size as small as a few nanometers. EBL has been one of the main such techniques for fabricating nanoscale patterns. EBL helps overcome the limitation of light-based nanotechnology measuring and fabricating tools, which are dependent on the wavelength of light (as higher the wavelength of light, the higher the energy of the light, which could subsequently cause unwanted side effects). EBL utilizes an accelerated electron beam focusing on an electron-sensitive resist to make an exposure. Subsequently, the electron-beam spot with a diameter as small as a few nanometers is scanned on the surface of resist in a dot-by-dot fashion to generate patterns in sequence. Electrons can induce the deposition of substances onto a surface (additive/negative), or etch away at the surface (subtractive/positive). Also, electrons can be used to etch a "mask" whose patterns can be later transferred onto a substance using other techniques.

Lithography techniques when combined with other fabrication processes such as deposition and etching, can be used to produce a high-resolution topography, and the cycle may be repeated several times to form complex micro/nanoscale structures.

Micro- and nano-lithography techniques that have been the mainstay of the semiconductor and integrated circuit (IC) industry have been used to create patterns with a feature size ranging from a few nanometers up to tens of millimeters.

Micro- and nano-lithography techniques have also been played an important role in manufacturing of commercial microelectromechanical system (MEMS) devices as well as prototype fabrication in emerging nanoscale science and engineering. These applications can significantly improve quality of life in many ways from electronic gadgets to healthcare and medical devices, for example, MEMS accelerometers employed in automobiles and consumer electronic devices, digital micromirror devices (DMD) for display applications in projectors and televisions, nanoelectronics for denser and faster computing, nanomedicine for diagnosis and treatment of diseases including, cancers, heart disease and Alzheimer's disease, nanoelectromechanical systems for high-sensitivity and high resolution sensing and manipulating, and nanobiosensors for ultra-low concentration and single molecular detection.

Unfortunately, one of the drawbacks associated with the process of conventional micro- and nano-lithographic techniques for generating patterns in organic materials requires complex fabrication steps such as metallization, deposition of masks, etching, and lithography. Furthermore, these steps often involve use of toxic chemicals. These chemicals are often expensive, bio-hazardous, difficult to handle, and requires specialized waste management.

Silk-Based Lithography Methods

The inventors of the present application sought a novel approach to high resolution nanopatterning techniques, which would do away with the use of toxic and/or biohazardous materials typically involved in conventional lithography, while preserving comparable resolution. The present invention thus provides silk-based e-beam lithography that's entirely green.

While silk fibroin materials, such as silk fibroin films, are known to offer excellent mechanical and optical properties (>90% transmission in the visible spectrum) and are currently being explored for applications in bio-electronics, optics, and bio-photonics, the present application demonstrates for the first time that silk fibroin materials can be effectively used as silk resist in lithography in truly green processing that requires no harsh toxic solvents. The present application thus provides methods for silk-based lithography, which support the adaptation of micro- and nano-lithographic fabrication techniques in organic electronics and optical characteristics, using silk fibroin materials as resist. Such methodology takes advantage of silk fibroin cross-linking as the on/off control for lithography.

Additionally, the environmentally benign, all-aqueous processing conditions and the chemistry of silk allow the silk fibroin materials to embody the interface between technology and biology by complementing their material traits with the ability to be a biologically favorable carrier in which dopants such as quantum dots, enzymes and proteins maintain their function.

These films possess useful properties that allow interfacing with metals and thin-film semiconductor devices, and the opportunity to develop biocompatible hybrid silk devices. This was recently demonstrated by using silk-based electrodes to measure neural activity in-vivo. Water-based silk solution extracted from natural silk fibers can be used as a precursor, similar to polydimethylsiloxane (PDMS), that can be cast on various micro- and nano-structured molds to replicate their surface topographies. Moreover, microscale metal-patterns transferred to silk fibroin films can be used as an etching mask.

Device manufacturing with silk fibroin films could provide benefits from fabrication methods that simplify patterning techniques by avoiding prolonged times of sample preparation, elevated temperature or high vacuum, which, aside from providing more complexity, would also limit the use of biologically active species.

As exemplified in the Examples below, in some embodiments, photonic crystal patterns may be generated onto silk fibroin resist by direct electron beam lithography. Such nanostructures may be fabricated with an suitable dose of electron beam, such as about 3000 $\mu C/cm^2$. In some embodiments, a square-lattice photonic crystal with different lattice constants (for instance, A=500, 600, and 700 nm) may be used to create a wide range of structural colors. Microscope image may be acquired by illuminating the photonic crystal patterns with a white light source. The lattice constant of nanostructures and the numerical aperture (N. A.) of the microscope objective lens determine the diffractive colors across the different letters. When nanostructures fabricated by such methods are observed under scanning electron microscope (SEM), SEM images show that high quality holes with radii of 0.25Λ may be successfully generated in silk fibroin films. According to the invention, the quality of these nanostructures is comparable to patterns fabricated with commercial resists such as PMMA and ZEP.

Figure 2:
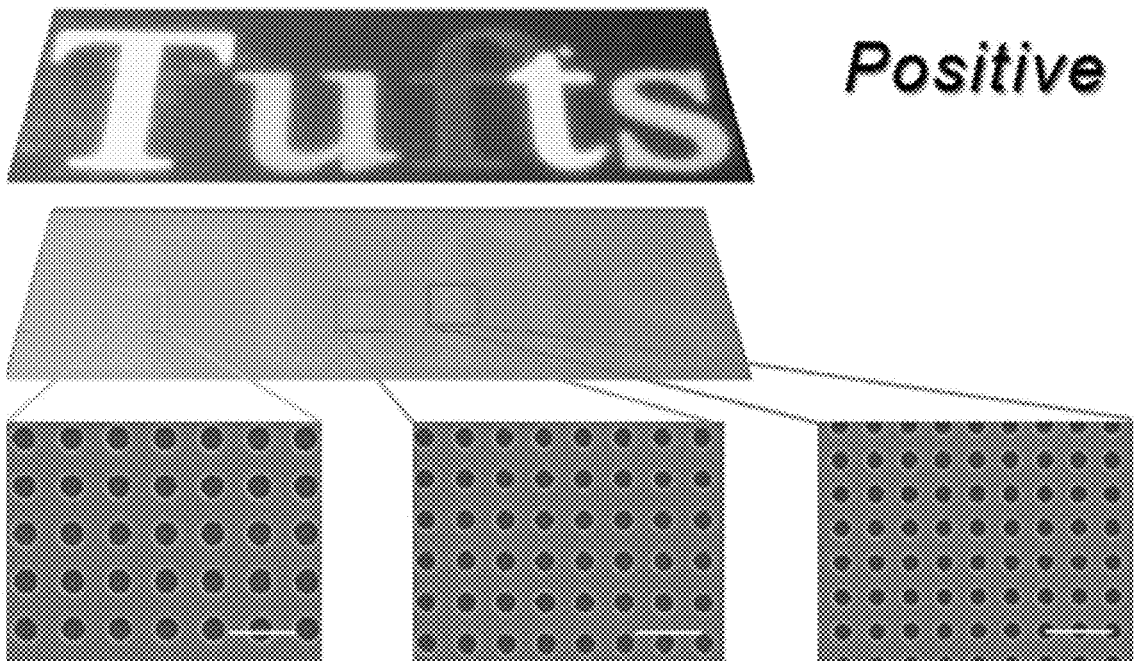
FIG. 2 show exemplary silk nanostructures (two dimensional photonic crystal patterns) generated by direct EBL: (a) "positive" tone resist; and (b) "negative" tone resist.
Figure 2:
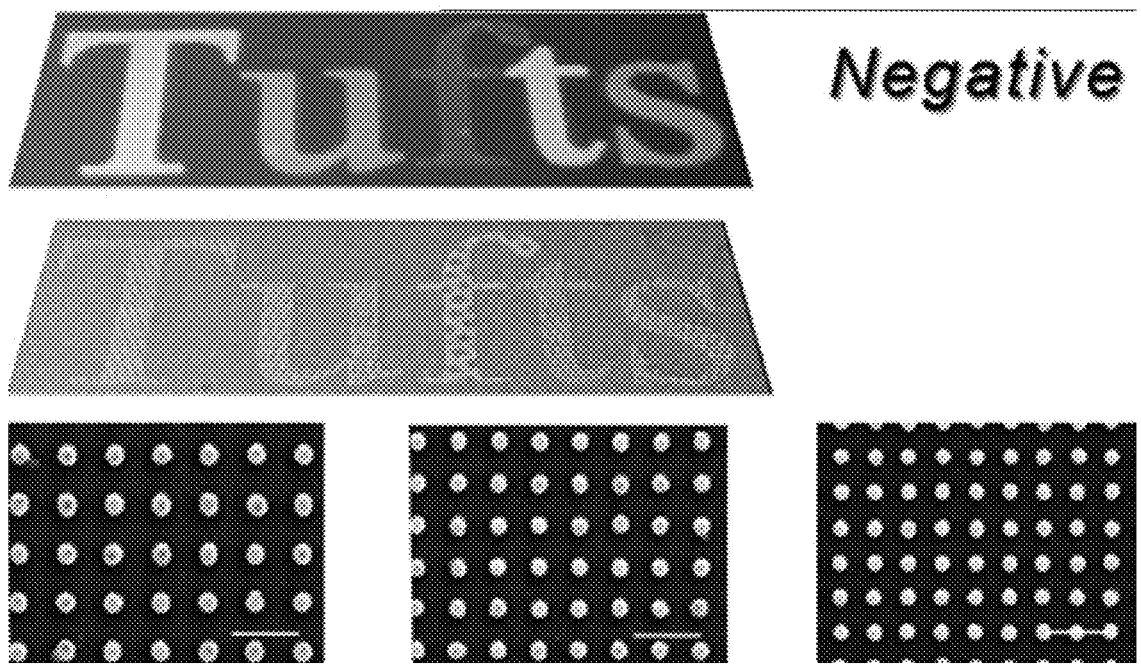

As exemplified in FIG. 2(a), silk nanostructure generated in positive tone resist may be observed in dark field microscopic image and SEM images. Each letter in the image "Tufts" shown in FIG. 2 is composed of the photonic crystal with different lattice constants (500, 600, and 700 nm), thereby revealing different structural colors. Same types of images may also be generated in negative tone resist, as demonstrated in FIG. 2(b). All scale bars represent 1 μm.

To study the effect of the electron beam dose, the PhC patterns can be fabricated by varying the beam dose. In some embodiments, for a fixed beam current (such as at 2 nA), the exposed dose ranges from 1000 $\mu C/cm^2$ to 5000 $\mu C/cm^2$ in 1000 $\mu C/cm^2$ increments. In some embodiments, the optimal dose value to fabricate the PhC patterns may be about 3000 $\mu C/cm^2$, which is approximately three times higher than what is needed to fabricate comparable structures with PMMA. To further evaluate the performance of silk fibroin as an electron beam resist, a one dimensional grating pattern with a fixed lattice constant of 1 μm and a line-width varying from 20, 60, 100, 200 to 400 nm has been created.

Coating & Patterning

As described above, the present invention includes lithographic methods for creating patterned silk fibroin layers. In some embodiments, to begin preparation of a silk biopolymer layer, a silk solution is coated on a substrate. Silk fibroin solution can be coated on a substrate (e.g., glass slide) by any number of coating methods. Exemplary liquid coating methods include but are not limited to spin coating, chemical solution deposition, spraying, dipping, etc. The conditions of the coating method typically determine the thickness of both the silk biopolymer solution and the eventual silk biopolymer layer. After deposition of the silk biopolymer solution, the solution is dried to provide a silk biopolymer layer. The thickness of the solution can vary between about 50 nm and about 500 nm. For example, between about 50 and about 100 nm, between about 50 nm and about 150 nm, between about 50 nm and about 200 nm, between about 50 nm and about 250 nm, between about 50 nm and about 300 nm, between about 50 nm and about 400 nm, between about 50 nm and about 500 nm, between about 100 nm and about 200 nm, between about 100 nm and about 250 nm, between about 100 nm and about 300 nm, between about 100 nm and about 400 nm, between about 100 nm and about 500 nm, between about 200 nm and about 250 nm, between about 200 nm and about 300 nm, between about 200 nm and about 400 nm, between about 200 nm and about 500 nm, between about 250 nm and about 300 nm, between about 250 nm and about 350 nm, between about 250 nm and about 400 nm, between about 250 nm and about 500 nm, between about 300 nm and about 400 nm, between about 300 nm and about 500 nm, or between about 400 nm and about 500 nm.

The concentration of the silk solution can also influence the preparation steps, the thickness and/or the surface properties (such as smoothness or texture) of the silk biopolymer layer. Useful concentrations of silk fibroin typically range between about 0.4% and about 10%, e.g., 0.4%, 0.5%, 0.6%, 0.7%, 0.8%, 0.9%, 1%, 2%, 3%, 4%, 5%, 6%, 7%, 8%, 9%, 10%, 11%, 12%, 13%, 14%, 15%, 16%, 17%, 18%, 20%, 21%, 22%, 23%, 24% and 25%. It should be noted, however, that silk fibroin concentrations should be kept below 4% for spin coating methods. More preferably, silk fibroin concentrations should be kept below 3%, below 2%, below 1.5%, below 1%.

After deposition of the silk biopolymer solution layer on the substrate, the solution can dried to produce silk biopolymer layer. In some embodiments, silk fibroin may be immobilized prior to drying, or after drying. The drying step may utilize any temperature and length of time need to produce a suitable silk fibroin layer. Alternatively, dehydrating gases can be used to create the silk biopolymer layer, as described in WO2007-016524.

Annealing may also (e.g., formation of crystallized silk, formation of β-sheets) be induced in several different ways. For example, exposure of silk fibroin materials to water vapor or alcohols (liquid or vapor) can induce beta sheet formation in the silk fibroin. The operating conditions involved in producing immobilized silk fibroin layer can vary depending on the method used. For example temperatures can range from about 4° C. temperature to about 200° C. The concentration of water (or alcohol) used to produce the annealed silk can vary from about 1% to about 100%.

The portion of silk biopolymer layer immobilized can range from about all of (i.e., substantially all of) the silk biopolymer layer to a percentage less than about 1%. The end form of the silk biopolymer layer will determine the extent of the silk biopolymer layer that is immobilized. In some embodiments, the entire silk biopolymer layer is immobilized. In some embodiments, at least about 10%, at least about 20%, at least about 30%, at least about 40%, at least about 50%, at least about 60%, at least about 70%, at least about 80%, at least about 90% at least about 100% of the silk biopolymer layer is immobilized.

Once the immobilized silk biopolymer layer is prepared, it can be patterned by exposure to energy sufficient to break the molecular bonds/interactions (e.g., hydrogen bonds) mediating annealing, e.g., between the silk fibroin molecules. In some embodiments, this energy is supplied by electrons sourced from electron beam apparatuses described in more detail below. Energetic electrons can break weak chemical bonds such as hydrogen bonds in the crystallized silk film, so that the exposed area can become soluble and washed out by a solvent (e.g., water). FIG. 1 illustrates the general fabrication procedure of direct nano-patterning on silk film using EBL. In some embodiments, other sources of electromagnetic radiation may supply the energy to break the molecular bonds/interactions so as to solubilize it.

In some embodiments, a silk biopolymer layer is prepared and then exposed to electromagnetic radiation (e.g., UV irradiation). In such embodiments, the silk biopolymer layer is not immobilized as part of the preparation. The electromagnetic radiation crosslinks the silk fibroin molecules. Thus, portions of the silk biopolymer layer exposed to the radiation will be crosslinked and becomes insoluble in a solvent, and un-exposed portions of the silk biopolymer layer will not be crosslinked and in turn will be soluble. The portions of the silk biopolymer layer exposed can be controlled to create a pattern in the silk biopolymer layer. After exposure to electromagnetic radiation, the silk biopolymer layer is developed by washing with a solvent, that removes the un-crosslinked silk biopolymer, leaving the crosslinked silk biopolymer. Again, the silk biopolymer layer can feature a patterned created by the electromagnetic radiation exposure.

In some embodiments, the "positive" (or subtractive) mode of electron beam lithography (often abbreviated as e-beam lithography, or EBL) is useful in creating nanostructures or an array thereof. As already explained, the process of EBL involves emitting a beam of electrons in a patterned fashion across a surface covered with a film. As described above, the film or surface, in some embodiments, is a silk biopolymer which is annealed. In some embodiments, the silk biopolymer is coated on a substrate (e.g., by spin coating) in preparation of patterning. As described above, the electrons from the serve to break annealed bonds within the silk biopolymer layer, rendering the un-annealed portions soluble in a solvent (e.g., water). Similarly, any representative portion of the annealed silk biopolymer layer can have its non-covalent bonds broken by EBL.

The portion of silk biopolymer layer that is no longer annealed after exposure to EBL can range from about all of the silk biopolymer layer to a percentage less than about 1%. The end form of the silk biopolymer layer will determine the extent of the silk biopolymer layer that is no longer annealed. In some embodiments, the entire silk biopolymer layer is no longer annealed. In some embodiments, at least about 10%, at least about 20%, at least about 30%, at least about 40%, at least about 50%, at least about 60%, at least about 70%, at least about 80%, at least about 90% at least about 100% of the silk biopolymer layer is no longer annealed.

Electron beam lithography can operate under a variety of conditions which affect the structure of the final product, and the efficiency of the operation. For instance, the electron beam lithography system can vary the current, velocity of the electrons, the energetic dose applied to the substrate to be patterned (e.g., the silk biopolymer layer) as well as beam size, distance between the substrate and the focusing lens of the electron beam lithography device. The conditions of the electron beam are influenced by a variety of factors of the desired final product as well as the properties of the silk biopolymer layer being patterned. For example, the diameter, spacing, lattice constant and thickness of the desired final product can determine the beam size, energy, duration and other operating parameters of the EBL process. Furthermore, the silk concentration, degree of immobilization of silk fibroin, thickness of the silk biopolymer layer will also influence the operation of the EBL process.

In some embodiments, the current used is on the order of nano-amperes (e.g. about 2 nA), but may vary from about 0.1 nA to about 100 nA. In some embodiments, the current is between about 0.1 nA and about 0.5 nA, between about 0.1 nA and about 1 nA, between about 0.1 nA and about 2 nA, between about 0.2 nA and about 1 nA, between about 0.1 nA and about 2 nA, between about 1 nA and about 5 nA, between about 1 nA and about 10 nA, between about 1 nA and about 20 nA, between about 5 nA and about 10 nA, between about 5 nA and about 20 nA, between about 5 nA and about 50 nA, between about 10 nA and about 20 nA, between about 10 nA and about 50 nA, between about 10 nA and about 100 nA, between about 20 nA and about 50 nA, between about 20 nA and about 100 nA or, between about 10 nA and about 20 nA.

In some embodiments, the energy dose varies between about 1000 µC/cm2 to about 5000 µC/cm2. In some embodiments, the energy dose is between about 1000 µC/cm2 and about 2000 µC/cm2, between about 1000 µC/cm2 and about 3000 µC/cm2, between about 1000 µC/cm2 and about 4000 µC/cm2, between about 2000 µC/cm2 and about 3000 µC/cm2, between about 2000 µC/cm2 and about 4000 µC/cm2, between about 2000 µC/cm2 and about 5000 µC/cm2, between about 3000 µC/cm2 and about 4000 µC/cm2, between about 3000 µC/cm2 and about 5000 µC/cm2 or between about 4000 µC/cm2 and about 5000 µC/cm2.

In some embodiments, the acceleration voltage can vary from about 10 keV to about 1000 keV. In some embodiments, the acceleration voltage is between about 10 keV to about 25 keV, between about 10 keV and about 50 keV, between about 10 keV and about 75 keV, between about 25 keV and about 50 keV, between about 25 keV and about 75 keV, between about 25 keV and about 100 keV, between about 50 keV and about 75 keV, between about 50 keV and about 100 keV, or between about 75 keV and about 100 keV.

Suitable operating conditions of the electron beam lithography system can be selected and modified based on a wide variety of factors. These includes the thickness of the substrate to be pattered (e.g., the silk biopolymer layer), where thicker films may require higher doses. Additionally, the size and nature of the features to be patterned influences the operating conditions of the electron beam lithography. For examples, electron scattering and generation of secondary electrons within the substrate to be patterned are factors suggesting lower doses when features in the low range of diameters or distances between are sought.

In some embodiments, aqueous silk solution (concentration of about 1%) may be spin-coated on a glass substrate to form a thin silk film. The thickness can be controlled by spin-speed and concentration of silk solution (described herein). The water soluble film may be treated either by methanol (and the like) or water vapor to crystallize the silk protein. In both cases, these films can be expected to demonstrate similar resolution and quality of patterning. In some embodiments, the electron beam patterning on the crystallized silk films may be carried out by using an EBL facility with 100 keV acceleration voltages. After exposure, the sample may be developed by immersion in distilled water to remove the exposed areas. All these fabrication steps may be carried out under all aqueous processing conditions.

After patterning (e.g., creation of a pattern by EBL or by cross-linking), the silk biopolymer layer has portions that are no longer immobilized and other portions of soluble silk biopolymer. The latter portion of the silk biopolymer can be dissolved in a solvent (e.g., water) while the former portion of silk biopolymer is not soluble in the same solvent. The silk biopolymer layer is then "developed" by washing silk biopolymer layer in the solvent, which dissolves the water-soluble portion of the silk biopolymer layer, leaving the immobilized portion intact. The silk biopolymer layer can feature a pattern created by the electron exposure. In some embodiments, the solvent is a non-toxic solvent. Exemplary solvents include but are not limited to water, and water-based buffers.

Additional Functionalization

As described, the present invention provides a completely water-based approach to nano-patterning (FIG. 1). This process is accomplished by eliminating unnecessary fabrication steps involving toxic chemicals and instead utilizing only EBL and water for direct nano-patterning of the silk fibroin protein.

In some embodiments, additional features may be incorporated for functionalization, including biological functionalization. The ability to easily dope silk with either inorganic and/or organic dopants provides augmented utility by allowing innumerable combinations of functionalized photoresists to be generated.

Using this process, working examples are presented below to demonstrate the feasibility of constructing several photonic structures, such as PhCs and diffractive gratings with nano-scale feature sizes and high aspect ratios. Furthermore, using the methods described in the present invention, PhC structures further comprising a light-sensitive element can be fabricated, which exhibit enhanced light-responsive signaling, providing evidence for the operativity of the present invention. Because the manufacture and operational processes are entirely water-based and can be performed under ambient environment, it provides ample flexibility as to biological applications. In particular, methods described herein can be effectively adapted to include dopants that are biological in nature, such as proteins, cells, and so on, which are prone to degradation and/or inactivation under a number of harsh chemical or environmental conditions. Therefore, the present silk fibroin materials of the present invention may be embedded or coated with at least one biologically active agent, such as: organic materials such as red blood cells, horseradish peroxidase, phenolsulfonphthalein, nucleic acid, a dye, a cell, an antibody, enzymes, for example, peroxidase, lipase, amylose, organophosphate dehydrogenase, ligases, restriction endonucleases, ribonucleases, DNA polymerases, glucose oxidase, laccase, cells, viruses, proteins, peptides, small molecules (e.g., drugs, dyes, amino acids, vitamins, antioxidants), DNA, RNA, RNAi, lipids, nucleotides, aptamers, carbohydrates, chromophores, light emitting organic compounds such as luciferin, carotenes and light emitting inorganic compounds (such as chemical dyes), antibiotics, antifungals, antivirals, light harvesting compounds such as chlorophyll, bacteriorhodopsin, proteorhodopsin, and porphyrins and related electronically active compounds, tissues or other living materials, other compounds or combinations thereof. The embedded organic materials are biologically active, thereby adding biological functionality to the resultant biopolymer photonic structure.

Furthermore, silk fibroin materials useful for the present invention may also be prepared and used in conjunction with (e.g., in combination with) one or more of other natural biopolymers including chitosan, collagen, gelatin, agarose, chitin, polyhydroxyalkanoates, pullan, starch (amylose amylopectin), cellulose, hyaluronic acid, and related biopolymers.

In further embodiments, the present invention contemplates methods and compositions comprising two or more layers of silk fibroin materials (e.g., layers). Important advantages and functionality can be attained by the biopolymer photonic crystal in accordance with the present invention, whether it is implemented by a single film or by an assembly of stacked films. In particular, as noted above, the biopolymer photonic structure can be biologically functionalized by optionally embedding it with one or more organic indicators, living cells, organisms, markers, proteins, and the like. It is therefore contemplated that each layer of a multi-layer silk fibroin composition (or similarly, each component of a multi-component silk fibroin composition) may be differentially or separately functionalized for desired effects.

The present invention will be better understood in connection with the following Examples. However, it should be understood that these examples are for illustrative purposes only and are not meant to limit the scope of the invention. Various changes and modifications to the disclosed embodiments will be apparent to those skilled in the art, and such changes and modifications including, without limitation, those relating to the methods and/or formulations of the invention may be made without departing from the spirit of the invention and the scope of the appended claims.

EXEMPLIFICATION

Biocompatibility and ease of biofunctionalization of nanostructured biological polymers would open opportunities for unattainable device applications, such as bioresorbable integration of photonic structure within living tissue or functional activation through biochemical activity. Electron beam lithography (EBL) is still a 'must-have' and a 'wide-use' item to demonstrate nanostructures. Versatility and relatively long history of EBL make the method inviolable from other patterning techniques. Demonstrated herein are methods for carrying out all water-based direct electron beam patterning onto silk fibroin, a noble biological polymer. Without the requirement of toxic or volatile chemicals, but with the use of only water or water-based agents, unique chemical properties of silk fibroin make it possible to enable double-faced patterning (positive/negative tone). Additionally, leveraging silk's easy dupability, a green fluorescent protein (GFP)-doped 2D photonic crystal (PhC) has been fabricated. Additional data are provided to demonstrate the signal-enhancement at the band-edges of the PhC.

Example 1

Molecular Basis for Immobilized Silk Fibroin

In the gland of *Bombyx mori* caterpillar, the water-soluble silk fibroin and the sericin, which is a water-soluble protein glue to coat the silk fiber, are spun together into a fiber, leading to a new insoluble conformation due to a rapid change in structure of the fibroin.[1,2] The sericin is added to the surface of silk fibroin during spinning, and the result is the formation of the silk fiber. By chemical procedure, the silk fibroin solution can be extracted from the cocoon, a bunch of the silk fiber. A silk film coming from the silk solution has random coil complex, which is water soluble. These random coils can be modified to two structural forms by phase transition: silk I and silk II.[3] Silk I refers to the complex helix-dominated structure existing within the caterpillars gland just before spinning, which is different from the water-soluble random-coil conformation of uncrystallized silk. Silk II is the water-insoluble antiparallel β-sheet crystal conformation, which forms after the spinning of silk fibers from the spinneret of the silkworm. Therefore the water-insoluble silk film can be achieved by increasing β-sheet content.

As mentioned above, the molecular structure in self-assembled silk fibroin films is basically random coil, which has water-soluble characteristics. By immobilizing the molecules, the silk film can be made stable in water, such that silk fibroin is rendered water-insoluble. To date, several techniques have been used to induce immobilization in silk fibroin material to make silk fibroin insoluble. The most common method is based on the chemical change during immersion of silk in organic solvents, such as methanol and ethanol.[16] An alternative method, to maintain all water-based processing, is so-called "water vapor annealing" which uses water molecules to plasticize the system to promote a silk water-bound network with higher chain mobility.[17] More recently, a controlled, slow evaporation technique for inducing annealing in silk fibroin has been discovered.

In addition to annealing-based immobilization of silk fibroin to produce water-insoluble silk fibroin materials, immobilization may also be carried out by a process herein referred to as crosslinking. For example, high energy irradiant of γ-ray or electron beam may be used to crosslink silk fibroin molecules.[18, 19]

Cross-linking methods are widely studied in polymer science in general but has not been well defined with respect to silk fibroin. Additionally high energy irradiation using g-ray and electron beam generates free-radicals, thereby cross-linking water-soluble polymers without requiring any added cross-linkers.[4] Recombination of the radicals results in the formation of covalent bonds and finally cross-linked structure. Poly(vinyl alcohol), poly(ethylene glycol), and poly(acrylic acid) are well-known examples of polymers which can be cross-linked with high energy irradiation. In biomolecules, silk would be an example for this technique.

Example 2

Silk Fibroin Resist

FIG. 1 illustrates the fabrication-procedure of direct nano-patterning on a silk film using EBL. Aqueous silk solution extracted from the *Bombyx mori* caterpillar was spin-coated on an arbitrary substrate such as a silicon and fused silica wafer to form a thin silk film. The thickness can be controlled by spin-speed and concentration of silk solution. For a positive resist, the water soluble film was treated either by methanol or water vapor to induce annealing, in order to immobilize the silk protein. Immobilized silk fibroin films prepared by either one of the methods of annealing reveal similar resolution and the quality of the patterns. The electron beam patterning on the immobilized (positive resist) and non-immobilized (negative resist) silk films were carried out by using an EBL facility with 100 keV acceleration voltages. Energetic electrons can break weak chemical bonds, such as hydrogen bonds in the crystallized silk positive resist (or crosslink the silk proteins in the negative resist), so that the exposed area can become soluble and washed out by water (insoluble and stable in water). After exposure, the sample was "developed" by immersion in distilled water. It is worth noting that all these fabrication steps were carried out under all aqueous processing conditions.

FIG. 2 shows the PhC patterns in the 200-nm-thick silk fibroin resist generated by the described method. Each individual letter consists of a square-lattice photonic crystal with different lattice constants (Λ=500, 600, and 700 nm). The dark-field microscopic image was acquired by illuminating the photonic crystal patterns with a white light source. The lattice constant of the individual letters and the numerical aperture (N. A.) of the microscope objective lens determine the diffractive colors across the different letters. Scanning electron microscope (SEM) images reveals that high quality holes with the radii of 0.25Λ were successfully generated in silk fibroin films. The quality of these nanostructures is comparable to patterns fabricated with commercial resists such as PMMA (see FIG. 8).

Example 3

Structural Characterization of Silk Resist—Resolution

Figure 5:
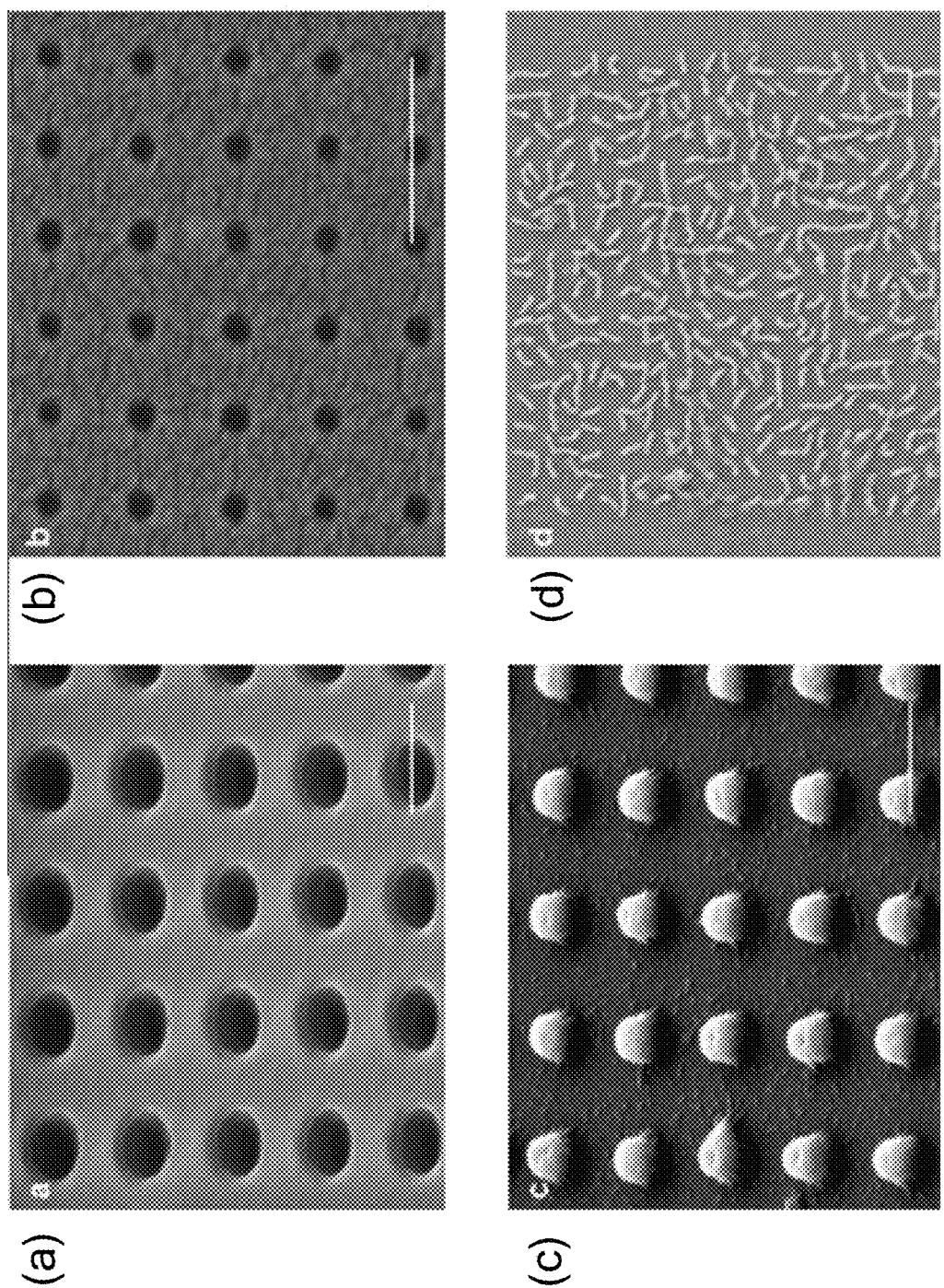
FIG. 5 provides a set of scanning electron microscope (SEM) images of the patterned silk resist. (a, c) Normalized reflectance of the blue SIO when in air (blue solid) and water (green solid). To compare with the calculated estimation, duplicated spectrum with the calculated reflectance peak (blue dash) is shown. Scale bars represent 400 nm. (b, d) SEM images of 30-nm feature in positive tone (b) and negative tone resist (d). Scale bars represent 200 nm.

To further evaluate the performance of silk fibroin as an electron beam resist, a two-dimensional (2D) array of holes, or voids, which is under the diameter of 100 nm was generated. Patterning of holes with the diameter of around 30 nm was reliably produced as shown in FIG. 5.

To characterize silk resist, a variety of square-lattice patterns having different radius and pitch size were generated onto silicon substrate. FIG. 5 shows scanning electron microscope (SEM) images of the silk resist patterns with positive and negative tone. The tilted view of the holes with the diameter of 200 nm reveals that silk resist have a good vertical profile with the aspect ratio of 1:1 (FIGS. 5 (a) and (c)).

Additionally minimum feature size of the resist was investigated. In FIGS. 5 (b) and (d), 30-nm features are successfully generated in both positive and negative tone, although the pillars in (d) is not rigidly able to stand since the hydrogel characteristic of silk makes the pillar mechanically weak during the water-development. Negative silk resist shows a tendency that the patterns fall down over the aspect ratio of 1:2.

Example 4

Functional Characterization of Silk Resist—Sensitivity

Figure 6:
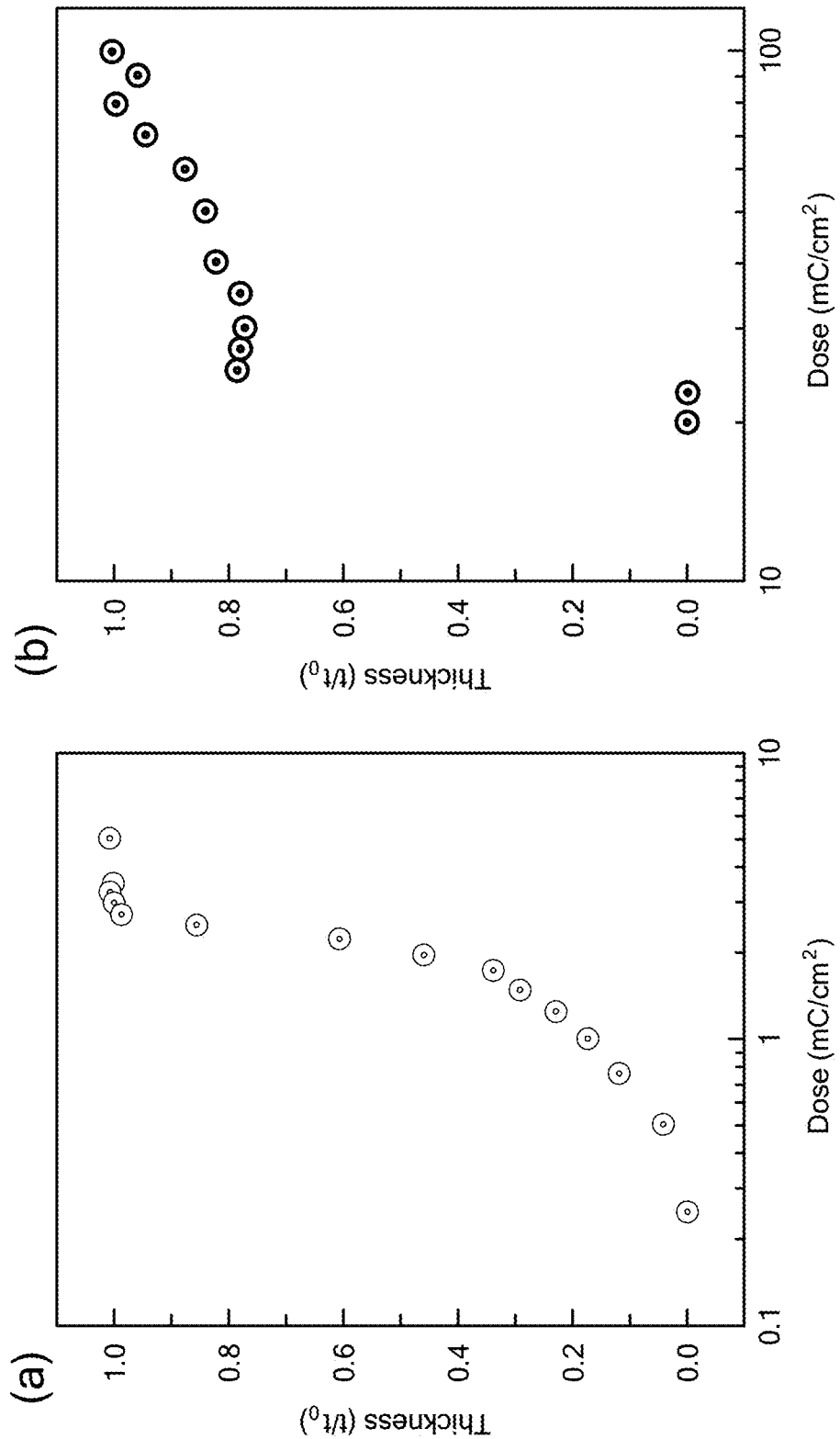
FIG. 6 shows sensitivity to electron dose characteristics for positive silk resist (a) and negative silk resist (b). (c) AFM images show the surface morphologies of a square pattern at different electron dose. Bottom graph is the cross section profile of the pattern. Red line is about 90 mC/cm$^2$ and blue line is about 40 mC/cm$^2$.
Figure 6:
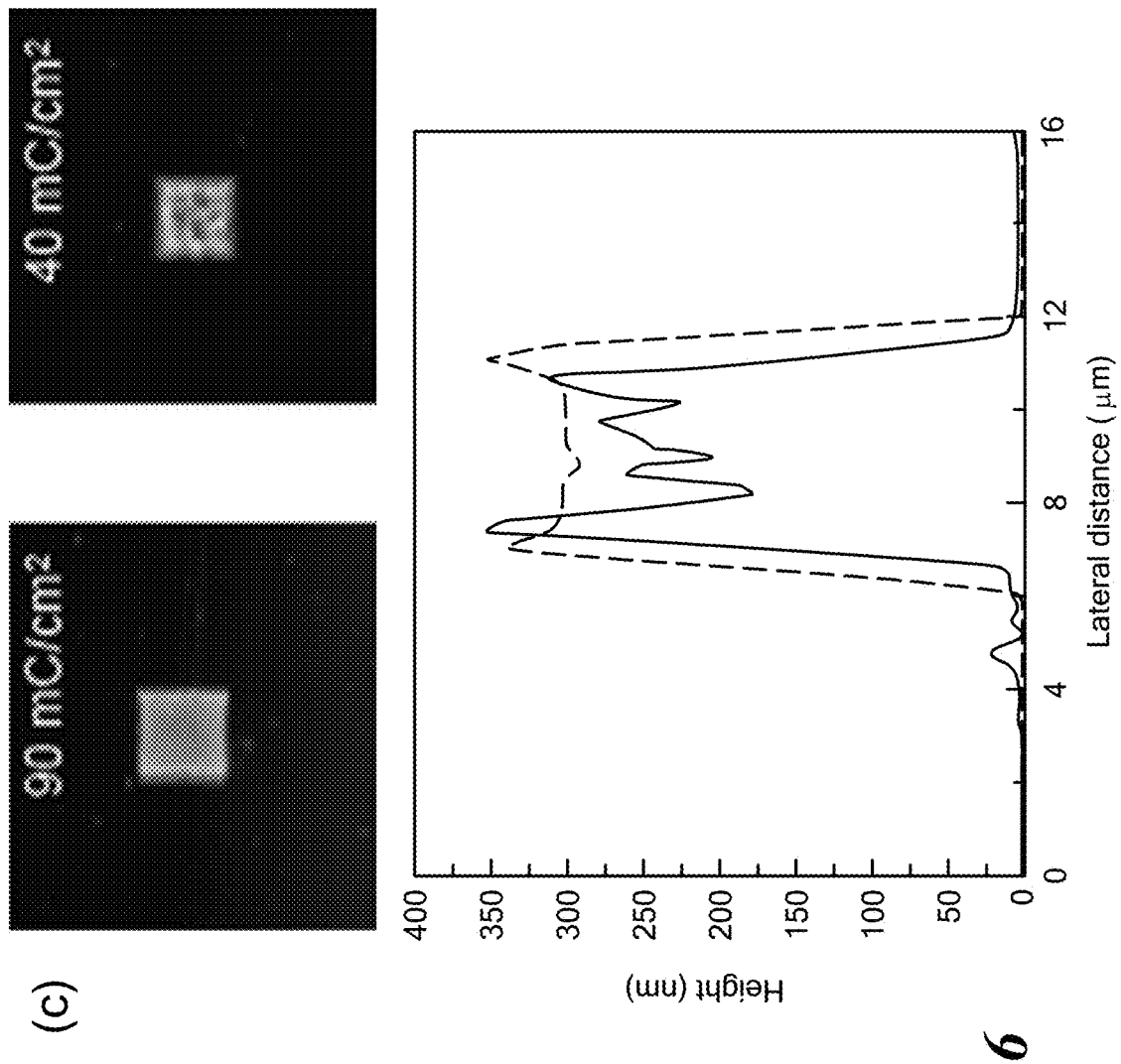

To study the sensitivity of the silk resist, a square micropattern was fabricated by varying the beam dose (see FIG. 6 in supplementary information). The sensitivity characteristics for silk resist are shown in FIGS. 6 (a) and (b). Electron beam is exposed onto 5-μm-square area in the crystallized and amorphous silk film (270-nm-thickness) with different doses. After developing the film, the atomic force microscope (AFM) was used to obtain the depth (height) of the etched (remaining) patterns. Since surface profile of the pattern is not even, the depth and height are averaged. In FIGS. 6 (a) and (b), the threshold of sensitivity is about 2.25 mC/cm$^2$ (positive) and 25 mC/cm$^2$ (negative). These threshold values indicate that silk resist requires 11 times higher dose for the negative pattern than the positive pattern. Along with these, the AFM images of the negative-tone patterns in which doses are between 25 and 80 mC/cm$^2$ show bumpy top-surfaces. At dose of over 90 mC/cm$^2$, the surfaces become flatter (FIG. 6(c)). We presume these values of dose aren't enough to build up perfect immobilization between silk molecules inside the block exposed by electron.

Example 5

Fabrication of Three-Dimensional (3D) Nanostructures

For a fixed beam current (2 nA) and high acceleration voltage (100 keV), we found the optimal dose value to be 2.25 mC/cm$^2$ (positive) and 25 mC/cm$^2$ (negative), which is approximately two times higher than what is needed to fabricate comparable structures with PMMA.[20, 21]

Figure 7:
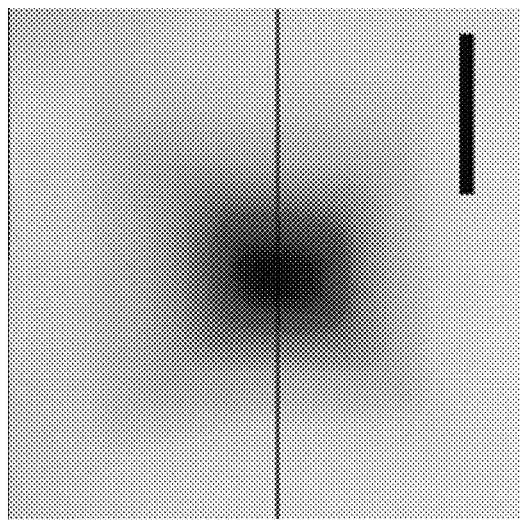
FIG. 7 demonstrates three dimensional structure of silk resist: (a) SEM image (top) and the distribution of dose (bottom); (b) AFM image of the pattern (top) and the cross section profile (bottom).
Figure 7:
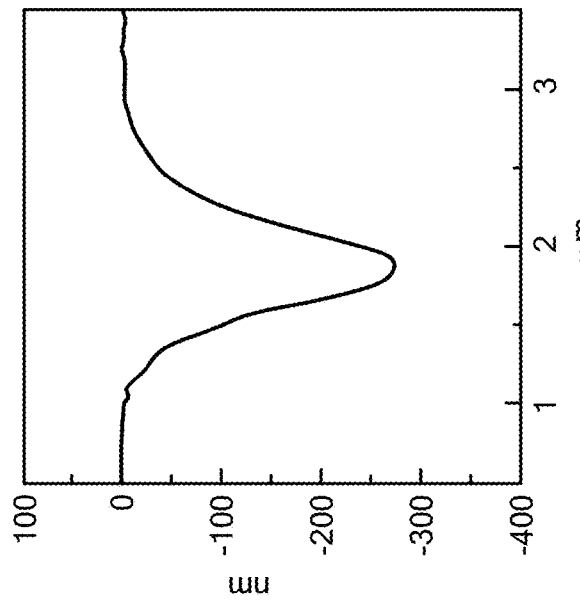
Figure 7:
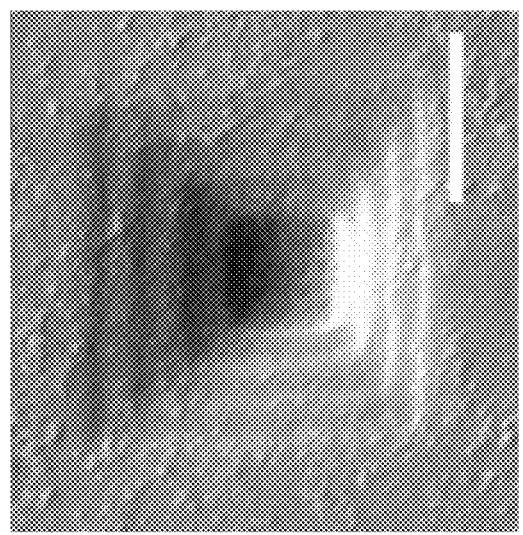
Figure 7:
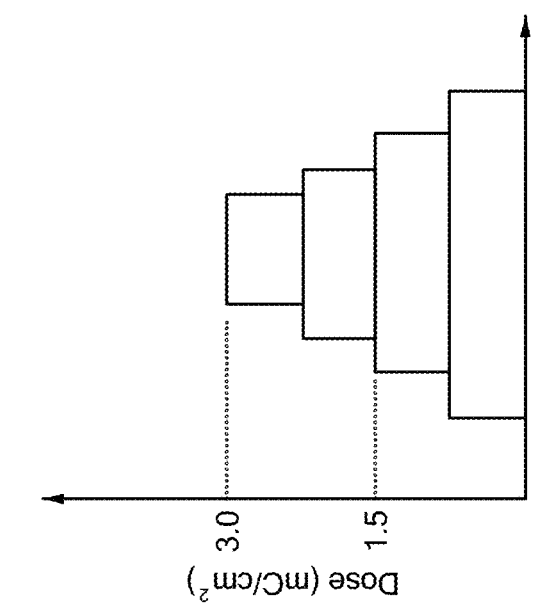

Increasing depth of the patterns when dose is increasing below the threshold would be a sign to form a three-dimensional (3D) structure. Using the property that the depth of the developed resist is proportional to the value of dose, a 3D nanopyramid was able to be fabricated by controlling area-dose (See FIG. 7). FIG. 7 shows SEM and AFM image of an inversed pyramid. Each pyramid was exposed 4 times with different dose and size. This technique is expected to be a building block for new types of sub-wavelength bio-photonic structures and nano-electronic components.

Example 6

Comparison of Silk Fibroin and PMMA as Resists

Figure 8:
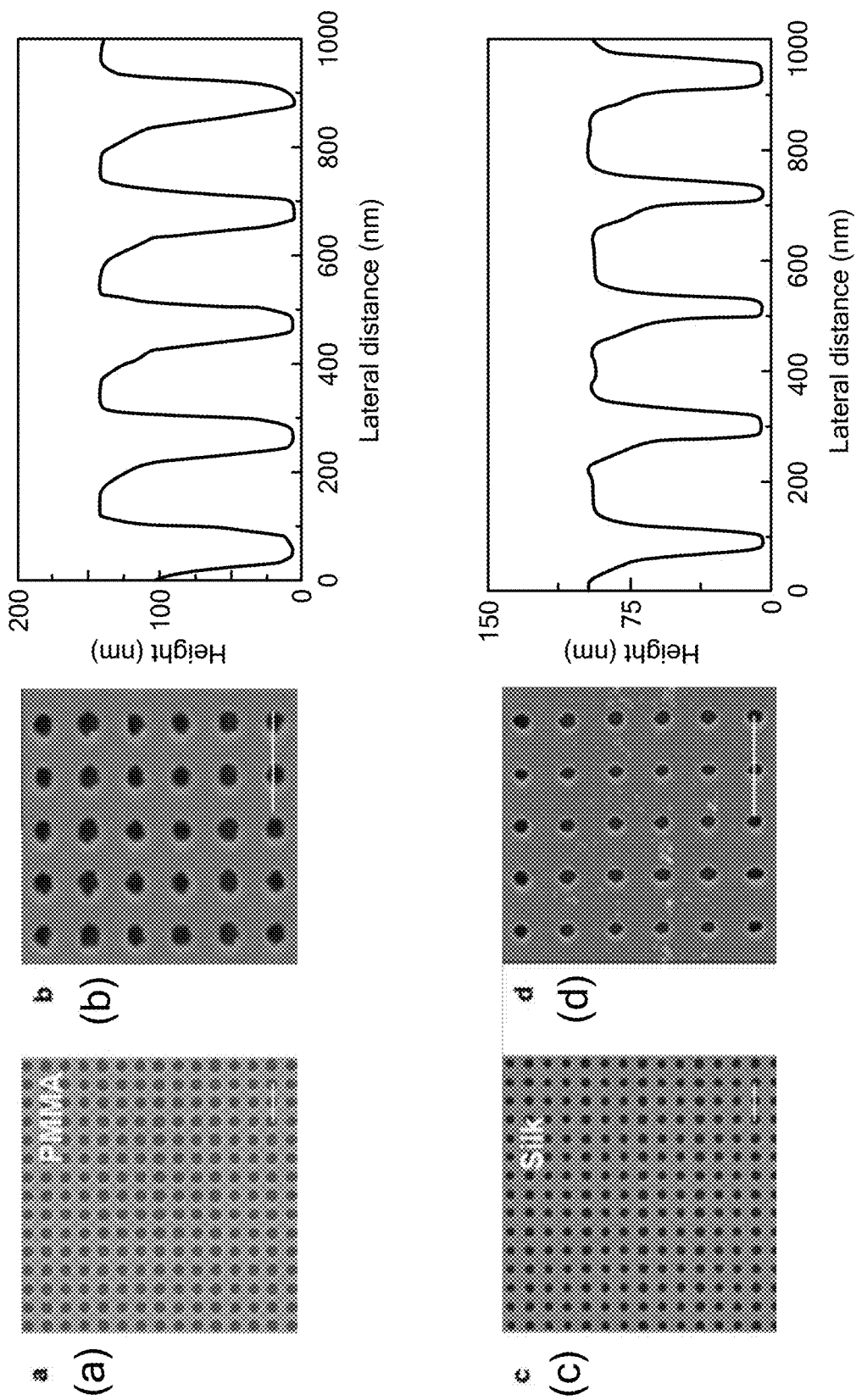
FIG. 8 provides comparison of silk resist with PMMA. SEM and AFM image of the square lattice pattern on the PMMA film (a, b) and the silk film (c, d). All scale bar represent 400 nm.

The profile of silk resist is compared with poly(methyl methacrylate) (PMMA), most well-known and widely-used. The square-lattice pattern with 200-nm pitch size and 100-nm diameter was generated on the PMMA (130-nm-thick) and the silk (80-nm-thick) resist film. The dose value was 1 mC/cm$^2$ (PMMA) and 3 mC/cm$^2$ (silk). Although the radius of holes in the PMMA film is slightly larger than silk due to the proximity effect, silk can stand comparison with PMMA in the regards of the shape of holes and the cross section profile (FIG. 8).

Example 7

Gain Enhancement at the Band-Edge and Calculation of Band-Structure

The photons in the photonic crystal (PhC) can propagate through the medium with extremely slow group velocity at the photonic band-edge, the point with zero slopes in the photonic band-structure.[5] When the PhC contains quantum elements, such as metal nanoparticle, quantum dot, and dye molecules, it provides a strong way to enhance their emission or absorption characteristics at the photonic band-edge.

To demonstrate the feasibility of functionalization of direct nano-patterning of silk fibroin films for photonic applications and explore the use of doped resists, we demonstrated fluorescent enhancement with a fully biological protein-material system composed of silk fibroin and the super folder GFP (sfGFP) variant. The fluorescent protein dopant is ideal for biosensor applications due to high quantum yield, high extinction coefficient, and the high resistance against denaturing through solvent, pH, high temperature or photo bleaching.[25]

Figure 3:
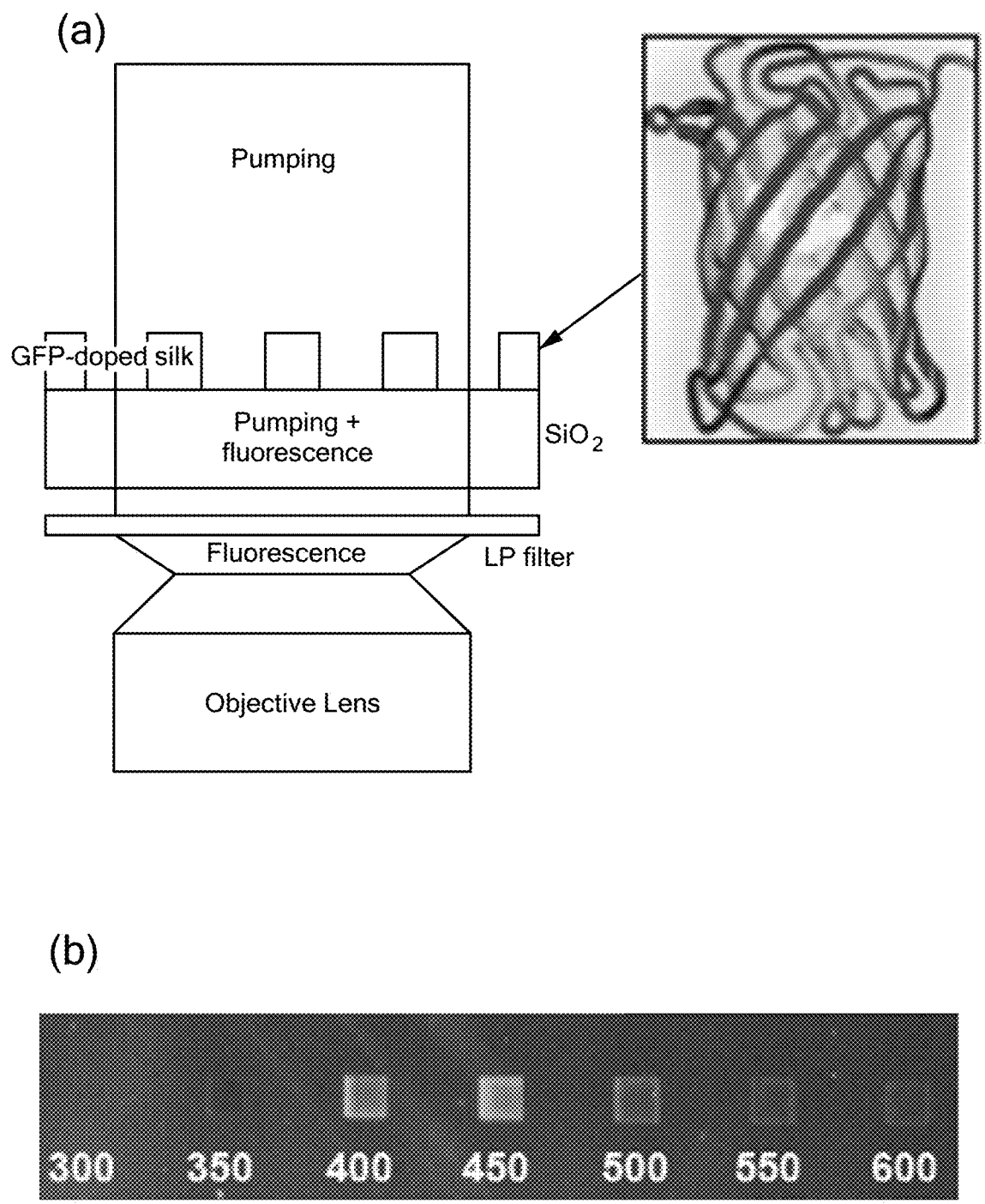
FIG. 3 depicts fluorescence-enhancement of GFP by the silk photonic crystal (PhC), demonstrating utility of direct nano-patterning of silk fibroin films in enhancement of fluorescence emission: (a) Schematic of the fluorescence measurement set-up is shown; (b) Multispectral CCD image of GFP-doped silk PhC showing fluorescent enhancement; (c) Spectra obtained from PhC with a lattice constant of 400 nm, 450 nm, and background. (d) Photonic band-structures for the lattice constant of 400 nm (blue) and 450 nm (green) calculated by the 3D PWE method.
Figure 3:
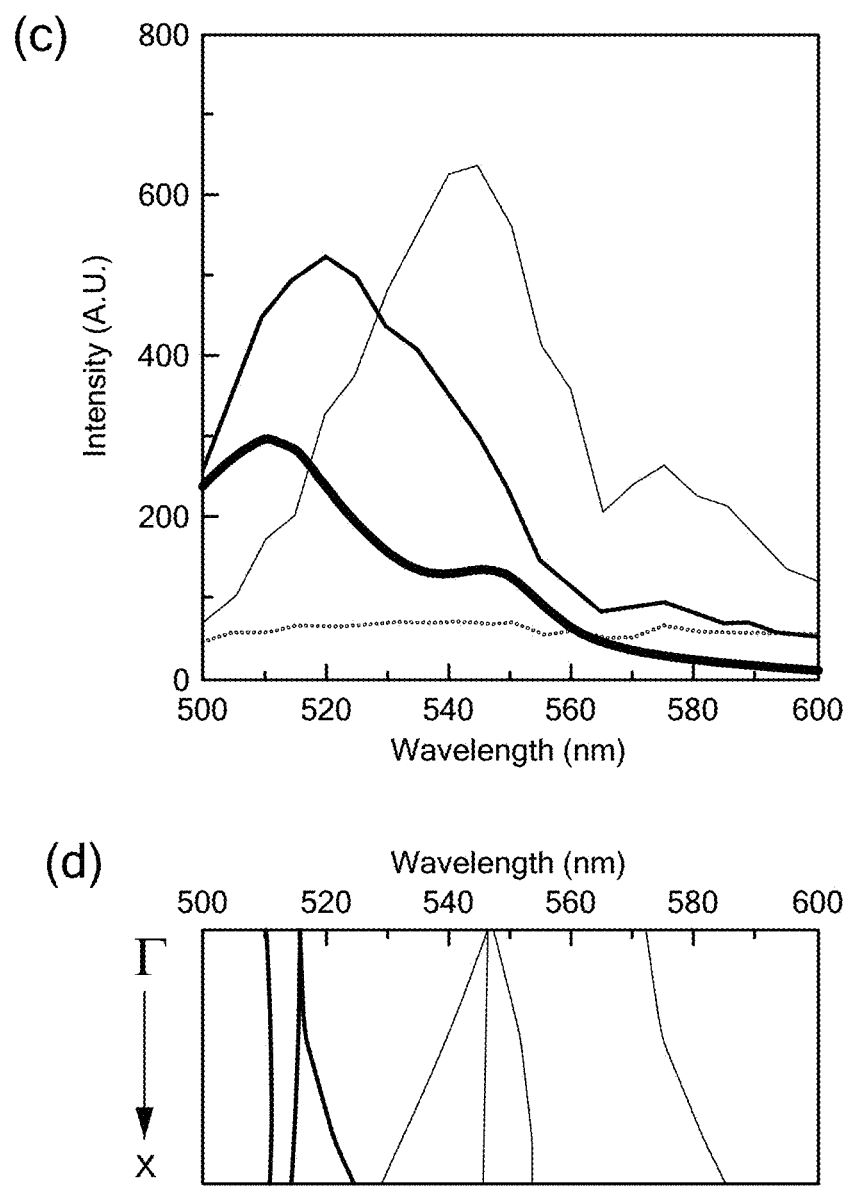

The GFP-doped silk fibroin solution (1 mM concentration) is spin-coated onto a silicon dioxide ($SiO_2$) layer with refractive index of 1.45, lower than silk ($n_{silk}$=1.54) to guide photons in a silk-slab. Subsequently, triangular PhC patterns with lattice constants (Λ) ranging from 300 to 600 nm with 50 nm increments are generated in which. The radius of hole is 0.3Λ and the thickness of the silk film is 150 nm. As shown in FIG. 3, the sample was excited from top surface using a 475 nm laser diode and the fluorescent emission was collected by an objective lens. The excitation light was blocked using a 495 nm long pass filter. FIGS. 3(*b*) and (*c*) shows a multispectral CCD image and spectra of the patterns. We found the highest fluorescence enhancement, to correspond with the band-edge modes from the photonic crystal structures with Λ of 400 and 450 nm, and that the enhanced fluorescent peaks shifted with changing lattice constants.

To estimate the enhancement of emission of green fluorescent protein (GFP) shown in FIG. 3, we calculated the photonic band-structure of the silk resist slab containing the triangular lattice hole array. A 3D plane-wave expansion (PWE) calculation was conducted using the MPB, open source PWE software distributed by MIT.[6] The refractive index used in the calculation was 1.54 (silk) and 1.45 ($SiO_2$). The radius was 0.3a (a is the lattice constant.). The thickness in the calculation was set to 130 nm (silk) and 100 μm ($SiO_2$), almost infinite thickness.

Figure 4:
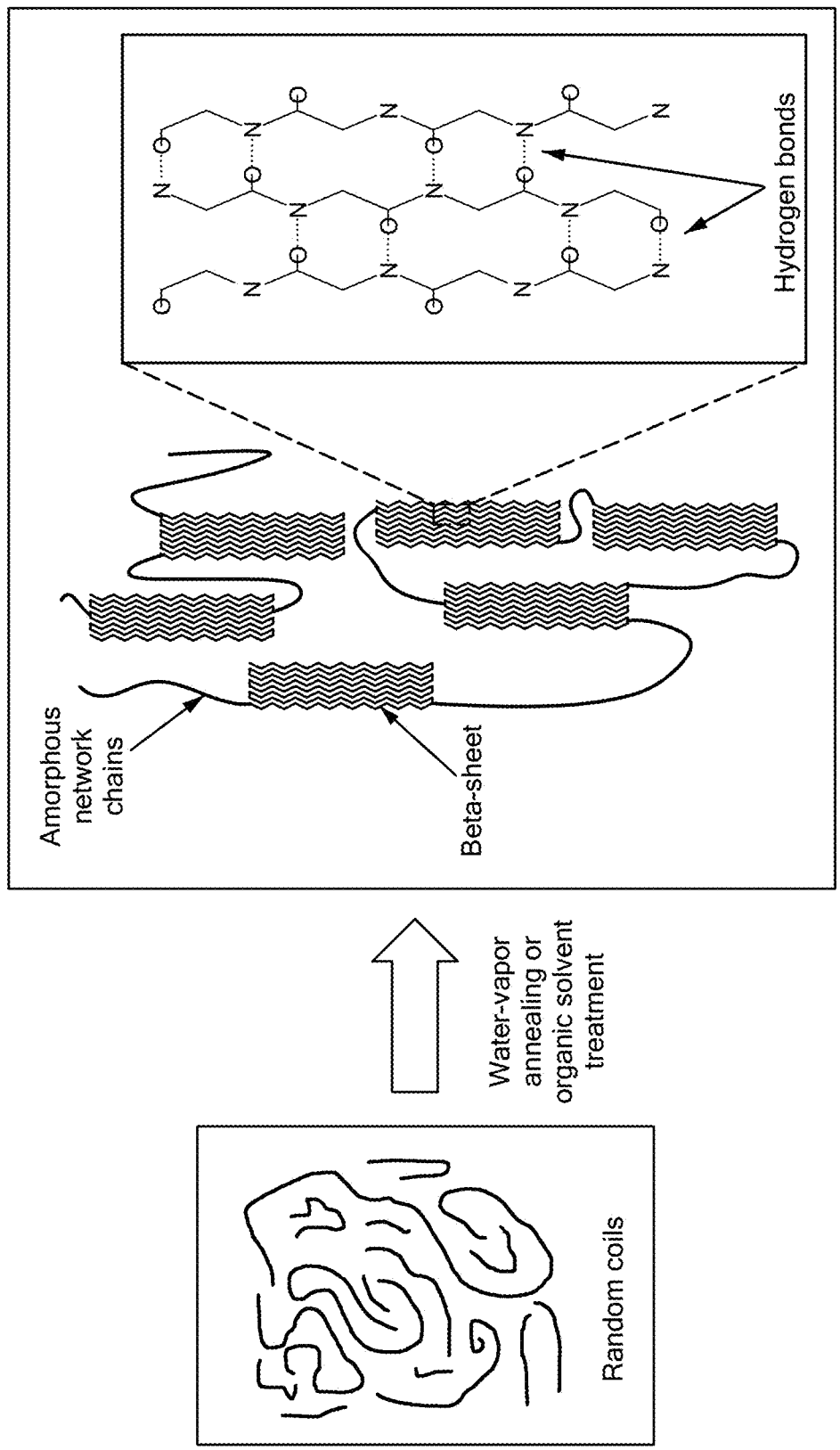
FIG. 4 provides schematic diagram of the formation of β-sheet. Through the annealing process, the structure of silk fibroin can be controlled to have large content of β-sheet.
Figure 9:
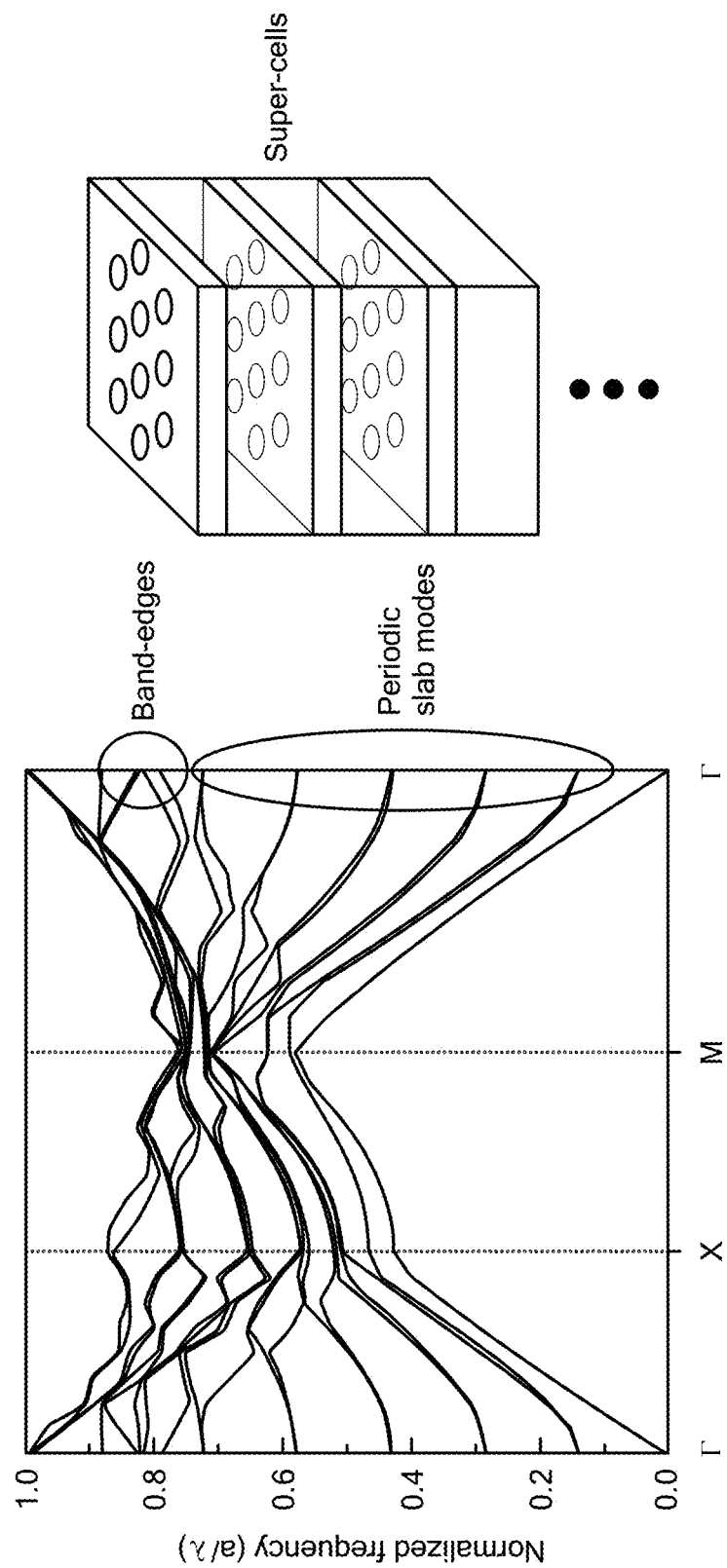
FIG. 9 presents theoretical estimation of the gain enhancement. Photonic band-structure calculated by the PWE method. At the band-edges (in red circle), the generated photons can be enhanced due to slow group velocity. The description of the super-cells used in the calculation is shown (right). The periodic slab is a reason that modes irrelevant to the 2D PhC are shown in the band-structure.
Figure 10:
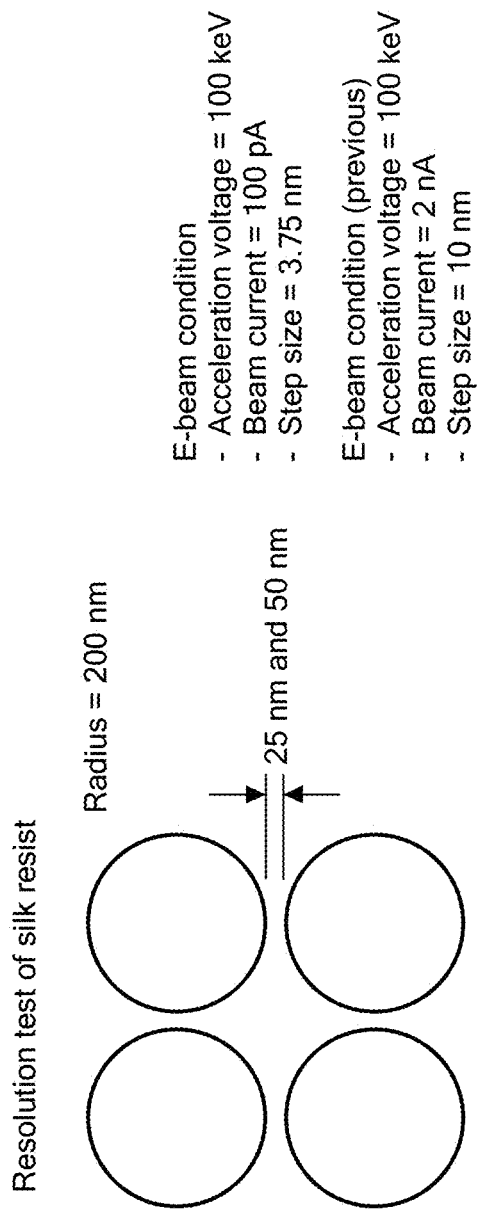
FIG. 10 illustrates a representative embodiment of silk resist resolution.
Figure 11:
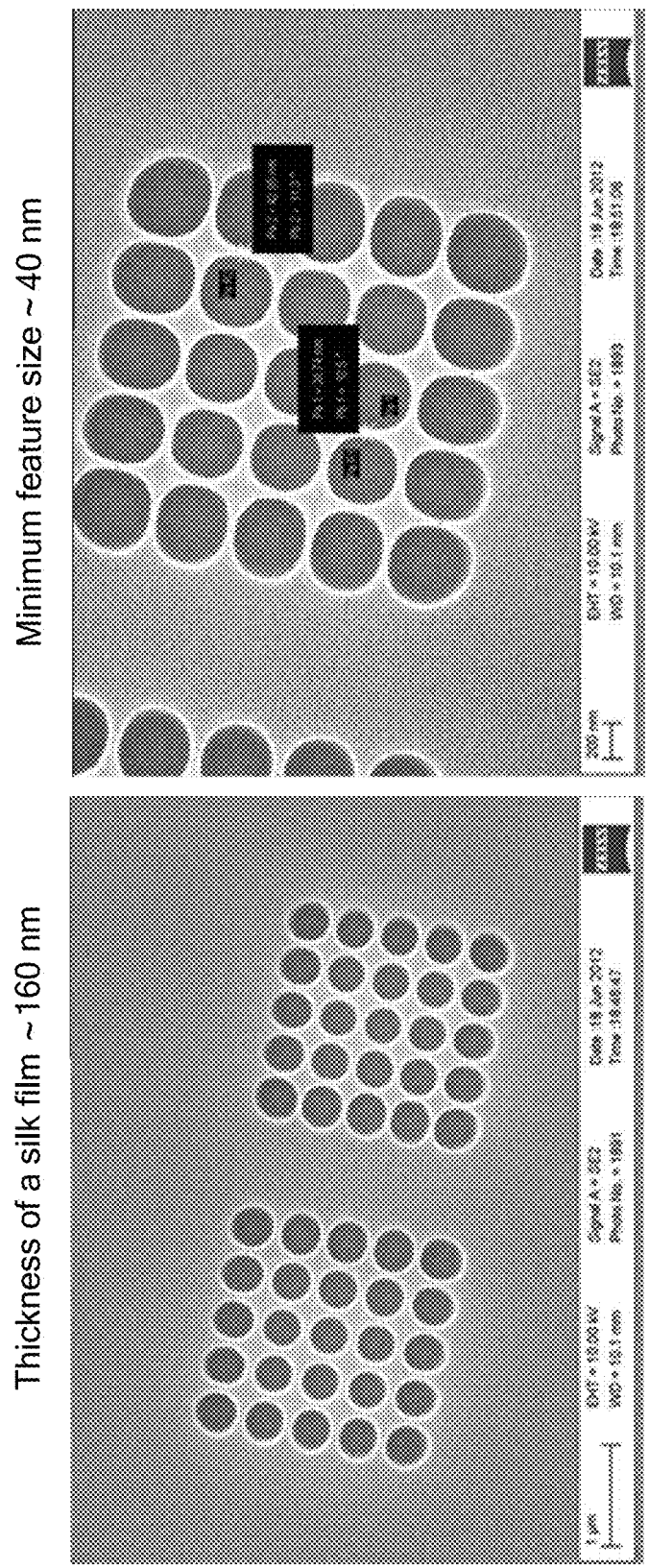
FIG. 11 provides images of nano-patterned voids produced on a silk film; Thickness of silk film ~160 nm, minimum feature size ~40 nm.
Figure 12:
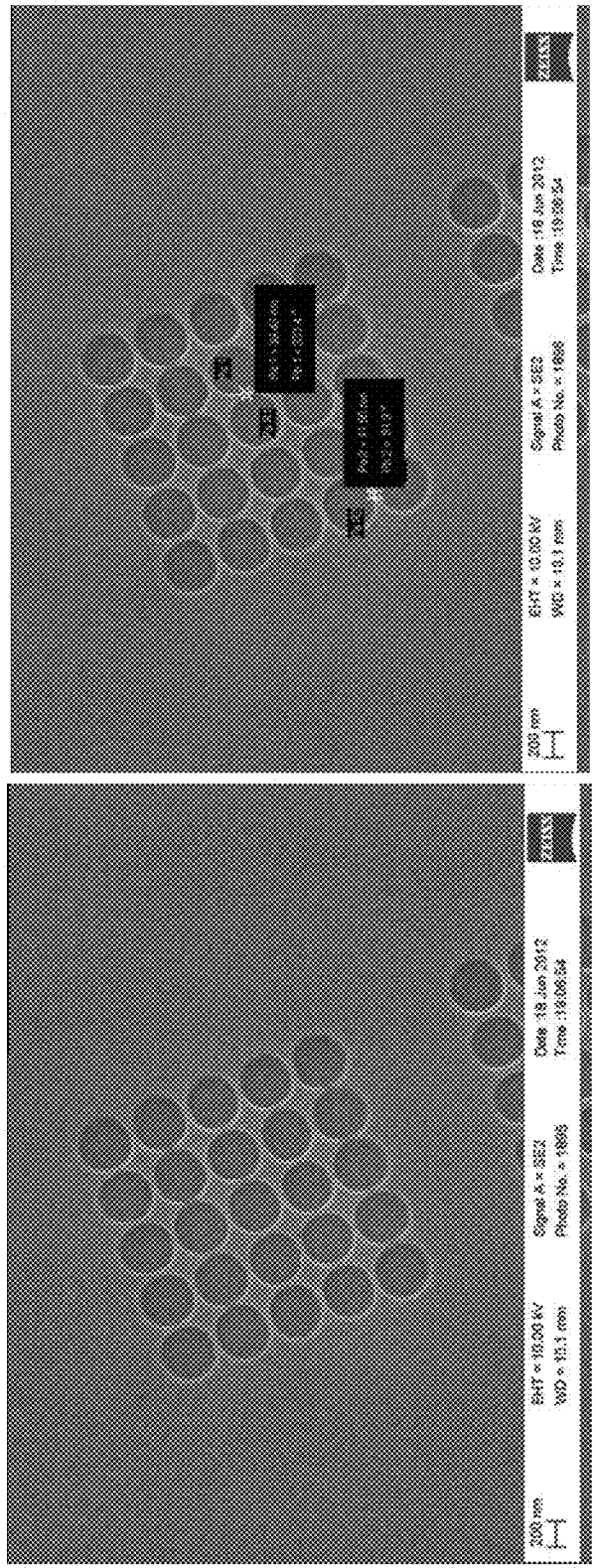
FIG. 12 provides images of nano-patterned voids produced on a silk film; Thickness of silk film ~80 nm, minimum feature size ~40 nm.
Figure 13:
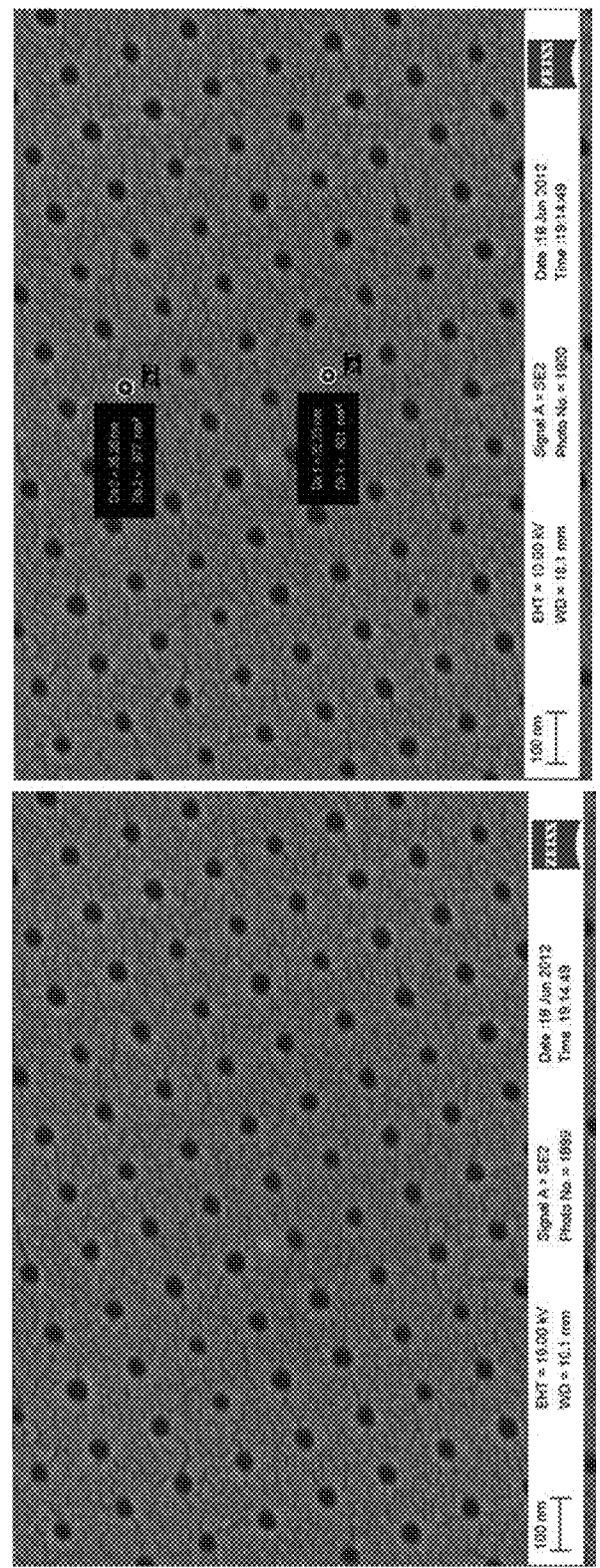
FIG. 13 provides images of nano-patterned voids produced on a silk film; Thickness of silk film ~80 nm, diameter of holes in CAD ~30 nm, and diameter of holes in SEM ~32 nm.
Figure 14:
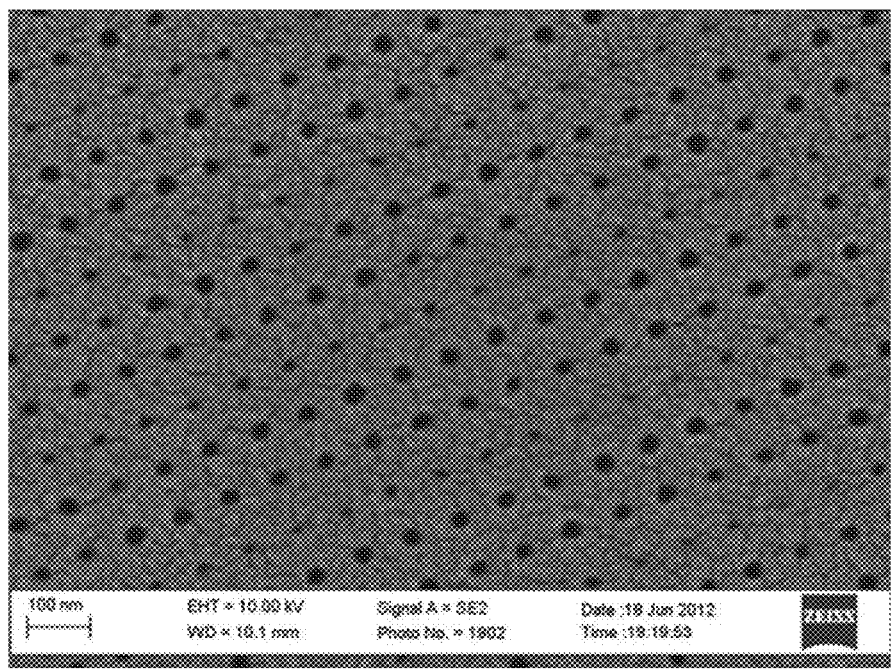
FIG. 14 provides images of nano-patterned voids produced on a silk film: (a) 20 nm feature but uneven pattern; (b) 50 nm feature and diameters of ~50 nm and ~57 nm in SEM.
Figure 14:
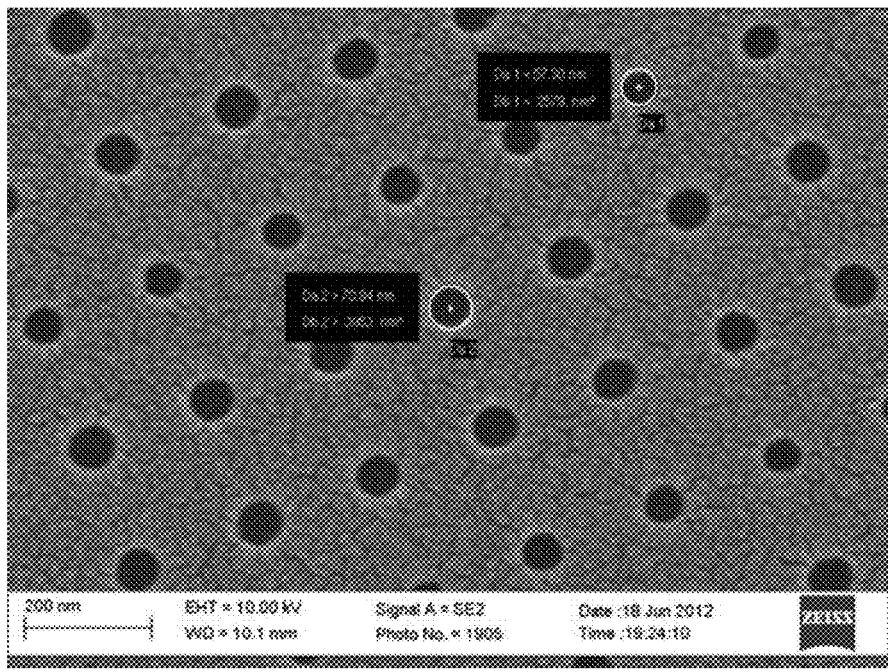
Figure 15:
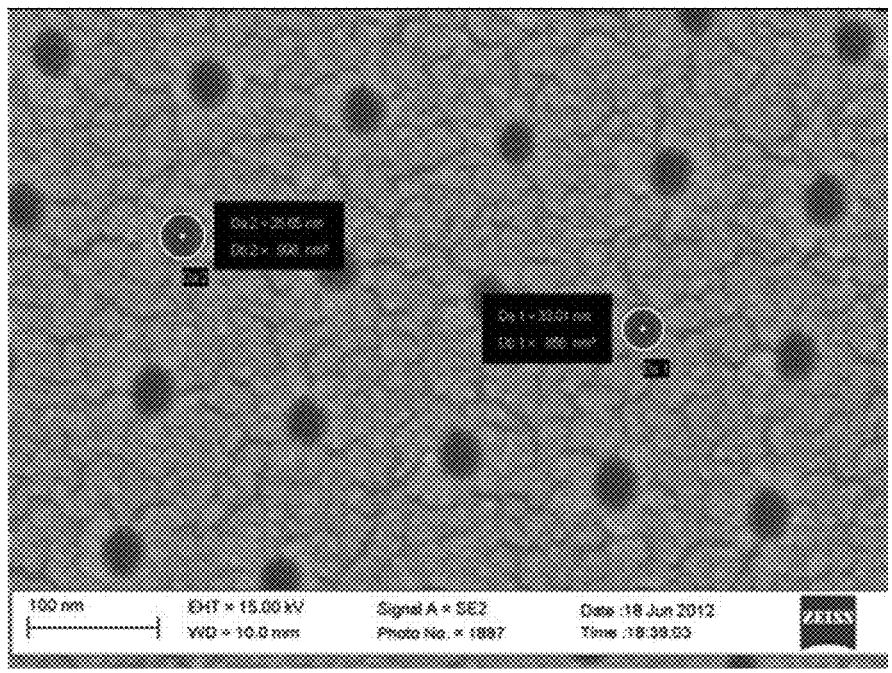
FIG. 15 provides images of nano-patterned voids produced on a silk film having the thickness of ~160 nm: (a) ~30 nm feature, 35 nm and 33 nm in SEM; (b) ~20 nm feature, 25 nm in SEM.
Figure 15:
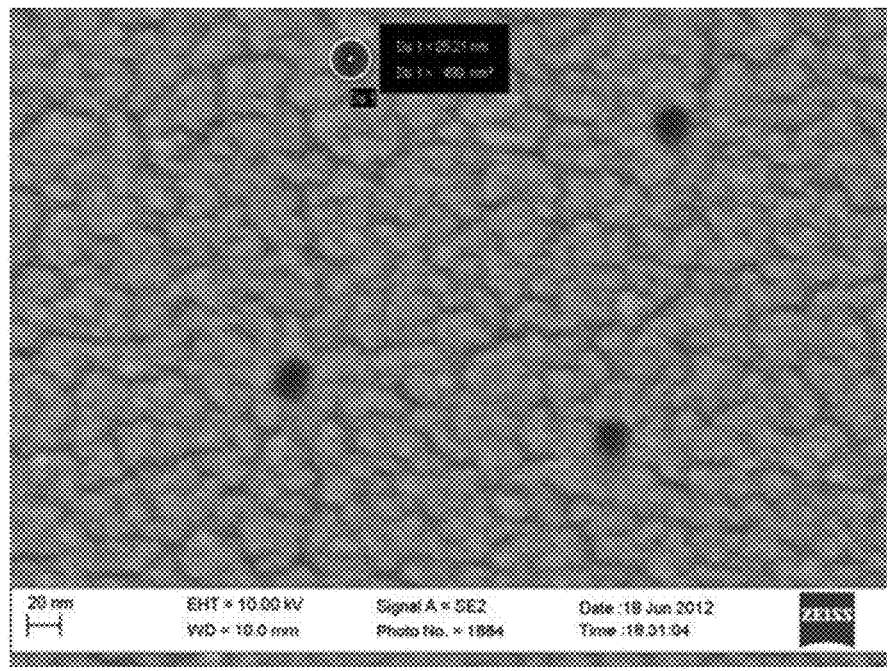
Figure 16:
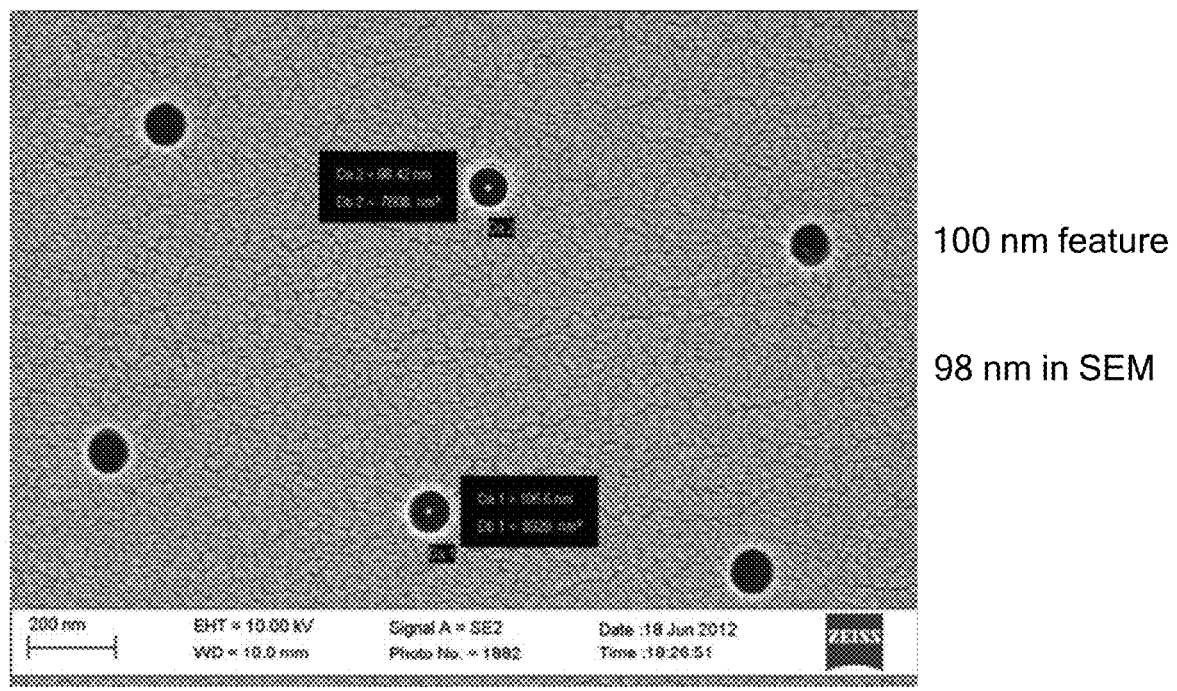
FIG. 16 provides an image of nano-patterned voids produced on a silk film; ~100 nm feature, 98 nm in SEM.

FIG. 9 shows the calculated band-structure. Since the calculation assumed that the structure was periodically arranged in all three dimensional direction, many unnecessary modes (periodic slab modes) were shown in the band-structure. These modes could be filtered out by multiple calculations changing the dimension of the super-cell with normal direction to the slab. At around the normalized frequency of 0.8, there are several band-edge modes at Γ-point that can enhance the gain of GFP. For the sake of convenient comparison, the normalized frequencies were converted to the wavelength scale considering the lattice constant in FIG. 4. Consistent with the experimental works in FIG. 3, the emission of GFP was strongly enhanced at the band-edge location in the photonic structure.

For the sake of convenient comparison, the normalized frequencies were converted to the wavelength-scale considering the lattice constant of the patterns. The band-edge modes that overlap the emission bandwidth of the GFP can be related to the enhanced extraction phenomena. Furthermore, deeper holes would increase the coupling efficiency between photons and the PhC structure, thereby improving the extraction efficiency.[26] The high aspect ratio holes and therefore improved fluorescence extraction efficiency achieved with this direct EBL method improve on structures previously fabricated with nano imprinting methods.[27] Along with that, direct EBL of silk fibroin films proposes a relatively simple, green scheme.

In conclusion, we have demonstrated that silk fibroin films can be used as a bio-based resist for direct electron-beam lithography. The process is entirely water based and offers a relatively simple method to generate nanoscale patterns with a high aspect ratio. in silk fibroin films. This approach eliminates the need to use chemicals, making this eco-friendly, and makes possible to achieve two-faced tone. Current studies (i.e. multiple beam exposure and interference lithography) have been elucidating strategies to overcome the low throughput issues of EBL.[28, 29] and making it possible to speculate on a fully green-process to manufacture biophotonic-chips using silk fibroin. The enhanced fluorescence emission from biologically derived GFP-doped silk PhC are the first steps to demonstrate the versatility of reformulating silk as a doped resist to add utility to materials that operate at the overlap of nanotechnology and biology.

Methods
Silk Fibroin Solution Preparation

Cocoons of the *Bombyx mori* silkworm were boiled for 30 minutes in a solution of 0.02M $Na_2CO_3$ to remove the sericin protein. The extracted fibroin was rinsed with distilled water and then dried in ambient air for 12 hours. After drying, the fibroin was dissolved in a 9.3M LiBr solution at 60° C. for 4 hours, yielding a 20 wt % aqueous solution, and subsequently the solution was dialyzed against distilled water using a dialysis cassette at room temperature for 48 hours until the solution reached a concentration of 8 wt %. The obtained solution was purified using a centrifuge and a 0.8 μm syringe filter. Fluorescent silk was prepared by adding fluorophores dissolved in water to the silk solution. The concentration of fluorescent silk solution was a 5.6 wt %.

Electron Beam Lithography

Silk fibroin solution was spin-coated on a silicon and fused silica substrate. To prepare the substrates for the fluorescence experiment, 500 nm thick $SiO_2$ was deposited on the substrate using plasma enhanced chemical vapor deposition system prior to spin-coating. To crystallize the silk fibroin films, the samples were treated in methanol at room temperature for one minute or water-vapor at 95° C. for two hours. An Elionix ELS-7000 system at 100 keV electron energy and 2 nA current was subsequently used. The exposed samples were developed in de-ionized water for a minute and dried using a nitrogen gas gun.

sfGFP Expression and Purification

The sfGFP plasmid vector was commercially obtained from Sandia BioTech/Theranostech, Inc. and transformed into chemically competent BL21 *E. coli* (Invitrogen) expression host. Transformed *E. coli* was plated on LB plates containing Kanamycin (Kan) (Fisher) antibiotic and incubated at 37° C. overnight. A single bacteria colony was selected and cultured at 37° C. overnight in 5 ml LB growth media (Fisher) containing Kan. The next day, a 2 liter volume LB growth media containing Kan was inoculated with the 5 ml starter culture and cultured shaking at 37° C. IPTG (Isopropyl β-D-1-thiogalactopyranoside) (Fisher) was added at OD 0.8 and cultured for an additional 5 h. Subsequently an *E. coli* pellet was obtained by centrifugation, re-suspended in lysis buffer and sonicated to aid cell lysis. sfGFP was purified by metal affinity column chromatography (NiNTA, Qiagen) and dialyzed. Aliquots were subsequently flash frozen and lyophilized until further use. For future use, sfGFP was re-suspended in DI water.

Measurement of Fluorescence

Spectral-resolved microscopy of the fluorescence were performed using a multispectral CCD camera (CRI Nuance FX) connected to an Olympus IX 71 inverted microscope. A λ=475 nm diode pumped solid-state laser for the GFP were used to pump the sample. The fluorescence was coupled to a 4× objective lens with 0.17 N. A. and pumping light was blocked by a long pass filter with a cut wavelength of 495 nm for the GFP.

Calculation of the Photonic Band-Structure

The photonic band-structure which was calculated by a PWE method was achieved using the MPB software package distributed by MIT. Three dimensional calculations were performed. The refractive index was 1.54 (silk) and 1.45 ($SiO_2$). The thickness of the silk slab was 150 nm. And the radius of holes was 0.3a (a is the lattice constant.) We have assumed that small amount of dopant does not significantly change the silk refractive index.

REFERENCES

1 Tearney, G. J., Brezinski, M. E., Bouma, B. E., Boppart, S. A., Pitris, C., Southern J. F. & Fujimoto J. G. In vivo 1 endoscopic optical biopsy with optical coherence tomography. *Science* 276, 2037-2039 (1997).
2 Chen, R. J., Bangsaruntip, S., Drouvalakis, K. A., Kam, N. W. S., Shim, M., Li, Y., Kim, W., Utz, P. J. & Dai, H. Noncovalent functionalization of carbon nanotubes for highly specific electronic biosensors. *PNAS* 100, 4984-4989 (2003).
3 Fan, X., White, I. M., Shopova, S. I., Zhu, H., Suter, J. D. & Sun, Y. Sensitive optical biosensors for unlabeled targets: A review *Anal. Chim. Acta* 620, 8-26 (2008).
4 Omenetto, F. G. & Kaplan, D. L. A new route for silk. *Nature Photon.* 2, 641-643 (2008).
5 Omenetto, F. G. & Kaplan, D. L. New opportunities for an ancient material. *Science* 329, 528-531 (2010).
6 Tao, H., Kaplan, D. L. & Omenetto, F. G. Silk materials—A road to sustainable high technology. *Adv. Mater.* 24, 2824-2837 (2012).
7 Pritchard, E. M., Dennis, P. B., Omenetto, F. G., Naik, R. R. & Kaplan, D. L. Physical and chemical aspects of stabilization of compounds in silk. *Biopolymers* 97, 479-498 (2012).
8 Perry, H., Gopinath, A., Kaplan, D. L., Negro, L. D. & Omenetto F. G. Nano- and micropatterning of optically transparent, mechanically robust, biocompatible silk fibroin films. *Adv. Mater.* 20, 3070-3072 (2008).
9 Kim, S., Mitropoulos, A. N., Spitzberg, J. D., Tao, H., Kaplan, D. L., & Omenetto, F. G. Silk inverse opals. *Nature Photon.* 6, 818-823 (2012).
10 Amsden, J. J., Domachuk, P., Gopinath, A., White, R. D., Negro, L. D., Kaplan, D. L. & Omenetto, F. G. Rapid nanoimprinting of silk fibroin films for biophotonic applications. *Adv. Mater.* 22, 1746-1749 (2010).
11 Tsioris, K., Tao, H., Liu, M., Hopwood, J. A., Kaplan, D. L., Averitt, R. D. & Omenetto, F. G. *Adv. Mater.* 23, 2015-2019 (2011).
12 Kim, D. H., Viventi, J., Amsden, J. J., Xiao, J., Vigeland, L., Kim, Y. S., Blanco, J. A., Panilatis, B., Frechette, E. S., Contreras, D., Kaplan, D. L., Omenetto, F. G., Huang, Y., Hwang, K. C., Zakin, M. R., Litt, B. & Rogers, J. A. Dissolvable films of silk fibroin for ultrathin conformal bio-integrated electronics. *Nature Mater.* 9, 511-517 (2010).
13 Martiradonna, L., Qualtieri, A., Stomeo, T., Carbone, L., Cingolani, R. & Vittorio, M. D. Lithographic nano-patterning of colloidal nanocrystal emitters for the fabrication of waveguide photonic devices. *Sens. Act. B* 126, 116-119 (2007).
14 Bae, M., Gemeinhart, R. A., Divan, R., Suthar, K. J. & Mancini, D. C. Fabrication of poly(ethylene glycol) hydrogel structures for pharmaceutical applications using electron beam and optical lithography. *J. Vac. Sci. Technol. B* 28, C6P24 (2010).
15 Jones, R. A., Li, W. X., Spaeth, H. & Steckl, A. J. Direct write electron beam patterning of DNA complex thin films. *J. Vac. Sci. Technol. B* 26, 2567 (2008).
16 Hu, X., Kaplan, D. L. & Cebe, P. Dynamic protein-water relationships during β-sheet formation. *Macromolecules* 41, 3939-3948 (2008).
17 Hu, X., Shmelev, K., Sun, L., Gil, E. S., Park, S. H., Cebe, P. & Kaplan, D. L. Regulation of silk material structure by temperature-controlled water vapor annealing. *Biomacromolucules* 12, 1686-1696 (2011).
18 Kojthung, A., Meesilpa, P., Sudatis, B., Treeratanapiboon, L., Udomsangpetch, R. & Oonkhanond, B. Effects of gamma radiation on biodegradation of *Bombyx mori* silk fibroin. *Int. Biodeterioration & Biodegradation* 62, 487-490 (2008).
19 Liu, J., Shao, J. & Zheng, J. Radiation grafting/crosslinking of silk using electron-beam irradiation. *J. Appl. Poly. Sci.* 91, 2028-2034 (2004).
20 Chen, W. & Ahmed, H. Fabrication of 5-7 nm wide etched lines in silicon using 100 keV electron-beam lithography and polymethylmethacrylate resist. *Appl. Phys. Lett.* 62, 1499-1501 (1993).
21 Duan, H., Winston, D., Yang, J. K. W., Cord, B. M., Manfrinato, V. R. & Berggren, K. K. Sub-10 nm half-pitch electron-beam lithography by using poly(methylmethacrylate) as a negative resist. *J. Vac. Sci. Technol. B* 28, 1071-1023 (2010).
22 Tarhan, I. I. & Watson, G. H. Photonic band structure of fcc colloidal crystals. *Phys. Rev. Lett.* 76, 315-318 (1996).
23 Kim, S., Lee, J., Jeon, H. & Kim. H. J. Fiber-coupled surface-emitting photonic crystal band edge laser for biochemical sensor applications. *Appl. Phys. Lett.* 94, 133503 (2009).
24 Tan, Y., Quan, W., Ding, S. & Wang, Y. Gold-nanoparticle-infiltrated polystyrene inverse opals: a three-dimensional platform for generating combined optical properties. *Chem. Mater.* 18, 3385-3389 (2006).
25 Pédelacq, J.-D., Cabantous, S., Tran, T., Terwilliger, T. C. & Waldo, G. S. Engineering and characterization of a superfolder green fluorescent protein. *Nature Biotech.* 24, 79-88 (2005).
26 Ferrini, R., Houdré, R., Benisty, H., Qiu, M. & Moosburger, J. Radiation losses in planar photonic crystals: two-dimensional representation of hole depth and shape by an imaginary dielectric constant. *J. Opt. Soc. Am. B* 20, 469-478 (2003).
27 Mondia J. P., Amsden, J. J., Lin, D., Negro, L. D., Kaplan, D. L. & Omenetto, F. G. Rapid nanoimprinting of doped silk films for enhanced fluorescent emission. *Adv. Mater.* 22, 4596-4599 (2010).
28 Multibeam Co. http://www.multibeamcorp.com
29 Solak, H. H., David, C., Gobrecht, J., Wang, L. & Cerrina, F. Multiple-beam interference lithography with electron beam written gratings. *J. Vac. Sci. & Technol. B* 20, 2844-2848 (2002).
30 Hu, X., Kaplan, D. L. & Cebe, P., Determining beta-sheet crystallinity in fibrous proteins by thermal analysis and infrared spectroscopy. *Macromolecules* 39, 6161-6170 (2006).
31 Jin, H.-J. & Kaplan, D. L. Mechanism of silk processing in insects and spiders. *Nature* 424, 1057-1061 (2003).
32 Hennink, W. E. & Nostrum, C. F. van Novel crosslinking methods to design hydrogels. *Adv. Drug Del. Rev.* 64, 223-236 (2012).
33 Dowling, J. P., Scalora, M., Bloemer, M. J. & Bowden, C. M. The photonic band edge laser: A new approach to gain enhancement. *J. Appl. Phys.* 75, 1896 (1994).
34 Johnson, S. G. & Joannopoulos, J. D. Block-iterative frequency-domain methods for Maxwell's equations in a planewave basis. *Opt. Express* 8, 173-190 (2001).

Certain aspects of the present invention relate to the following patent applications, the contents of which are incorporated by reference herein: WO 2008/127404; WO 2008/118211; WO 2008/127402; WO 2008/127403; WO 2008/127401; WO 2008/140562; WO 2008/127405; WO 2009/061823; WO 2009/155397; WO 2010/126640; WO 2011/046652; WO 2011/026101; WO 2011/160098; WO 2012/054121; WO 2011/115643; WO 2011/130335; WO 2011/112931; WO 2012/047682; WO 2012/031282; WO 2012/094436; WO/2012/145739; PCT/US12/68046; PCT/US12/59834 and U.S. Provisional Application 61/791,358 (filed Mar. 15, 2013, entitled "SILK WATER LITHOGRAPHY."

The invention claimed is:

1. A method comprising steps of:
providing a solidified silk fibroin layer,
wherein the solidified silk fibroin layer is substantially soluble so that it dissolves when washed with aqueous solvents;
selectively immobilizing a first portion of the silk fibroin layer, such that the first portion is substantially insoluble so that it remains intact when washed with aqueous solvents,
wherein the step of selectively immobilizing comprises crosslinking,
wherein the crosslinking step is or comprises irradiation, exposure to electron beam, exposure to γ-ray, photo-crosslinking, or UV crosslinking and wherein the cross-linked silk fibroin is characterized by covalent bonds in silk fibroin, wherein crosslinking of silk fibroin occurs without adding crosslinking agents, and developing the solidified silk fibroin layer, so that substantially all of the soluble solidified silk fibroin layer that is not of the selectively immobilized first portion of the solidified silk fibroin layer is washed away, wherein the selectively immobilized first portion is or comprises features formed of the solidified silk fibroin layer and/or features formed in the solidified silk fibroin layer.

2. The method of claim 1, wherein the developing step comprises washing away the soluble solidified silk fibroin layer with a water-based agent.

3. The method of claim 1, wherein the providing step comprising a step of depositing or spin coating a silk fibroin solution on a substrate.

4. The method of claim 1, prior to the step of immobilizing, further comprising a step of selectively solubilizing less than all of the silk fibroin molecules of the first portion of the solidified silk fibroin layer in a predetermined pattern.

5. The method of claim 1, wherein a second portion comprises a plurality of voids.

6. The method of claim 1, wherein the immobilizing step comprises crosslinking of the solidified silk fibroin layer in a predetermined pattern.

7. The method of claim 1, wherein the covalent bonds are formed with tyrosine residues of the silk fibroin.

8. The method of claim 1, wherein the step of crosslinking comprises formation of free radicals.

9. The method of claim 4, wherein the step of selectively solubilizing comprises a step of exposing the less than all of the molecular bonds of the silk fibroin molecules of the first portion of the silk fibroin layer to an electron beam.

10. The method of claim 1, wherein the crosslinked silk fibroin comprises intra-molecular and/or inter-molecular interactions formed comprise hydrogen bonds, hydrophobic interactions, ionic interactions, and/or covalent bonds.

11. The method of claim 1, wherein the features are patterned.

12. The method of claim 11, wherein the patterned features are arranged in an array.

13. The method of claim 11, wherein the patterned features are periodic or aperiodic.

14. The method of claim 1, wherein the features are holes or voids.

15. The method of claim 1, wherein selectively immobilizing further comprises an annealing step, wherein the annealing step comprises dehydrating the silk fibroin layer; treating the silk fibroin layer with a plasticizing agent; or slowly evaporating water from the silk fibroin layer, and wherein the annealed silk fibroin is characterized by beta-sheet secondary structure.

16. The method of claim 15, wherein the plasticizing agent is water vapor.

* * * * *